United States Patent
Watanabe et al.

(10) Patent No.: US 8,329,384 B2
(45) Date of Patent: Dec. 11, 2012

(54) RESIST-MODIFYING COMPOSITION AND PATTERN FORMING PROCESS

(75) Inventors: Takeru Watanabe, Joetsu (JP); Kazuhiro Katayama, Joetsu (JP); Masashi Iio, Joetsu (JP); Jun Hatakeyama, Joetsu (JP); Tsunehiro Nishi, Joetsu (JP); Takeshi Kinsho, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 264 days.

(21) Appl. No.: 12/785,930

(22) Filed: May 24, 2010

(65) Prior Publication Data

US 2010/0297563 A1   Nov. 25, 2010

(30) Foreign Application Priority Data

May 25, 2009   (JP) .................. 2009-125429

(51) Int. Cl.
G03F 7/00 (2006.01)
G03F 7/004 (2006.01)
G03F 7/40 (2006.01)

(52) U.S. Cl. ............... 430/312; 430/270.1; 430/271.1; 430/273.1; 430/322; 430/330; 430/331; 430/927

(58) Field of Classification Search ............. 430/270.1, 430/312, 322, 330, 331, 271.1, 273.1, 927
See application file for complete search history.

(56) References Cited

U.S. PATENT DOCUMENTS

| | | |
|---|---|---|
| 6,312,867 B1 | 11/2001 | Kinsho et al. |
| 7,537,880 B2 | 5/2009 | Harada et al. |

(Continued)

FOREIGN PATENT DOCUMENTS

EP   2128706 A1   12/2009

(Continued)

OTHER PUBLICATIONS

B. J. Lin, "Semiconductor Foundry, Lithography, and Partners", Proceedings of SPIE, 2002, p. xxix, vol. 4690, Cited in Spec.

(Continued)

*Primary Examiner* — Amanda C. Walke
(74) *Attorney, Agent, or Firm* — Westerman, Hattori, Daniels & Adrian, LLP

(57) ABSTRACT

A patterning process includes (1) coating a first positive resist composition onto a substrate, baking, exposing, post-exposure baking, and alkali developing to form a first resist pattern, (2) coating a resist-modifying composition onto the first resist pattern and heating to effect modifying treatment, and (3) coating a second positive resist composition, baking, exposing, post-exposure baking, and alkali developing to form a second resist pattern. The resist modifying composition comprises a base resin comprising recurring units having formula (1) wherein $A^1$ is alkylene, $R^1$ is H or methyl, $R^2$ is alkyl or bond together to form a nitrogen-containing heterocycle, and an alcohol-based solvent.

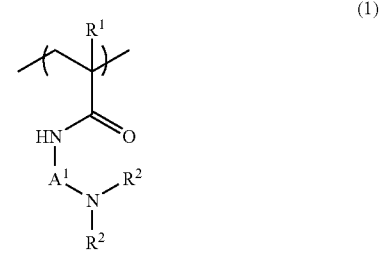

(1)

10 Claims, 8 Drawing Sheets

COAT, EXPOSE AND DEVELOP 2ND PHOTORESIST

U.S. PATENT DOCUMENTS

| | | | |
|---|---|---|---|
| 7,745,093 B2 * | 6/2010 | Nishibe et al. | 430/270.1 |
| 7,894,023 B2 * | 2/2011 | Ando et al. | 349/106 |
| 7,923,200 B2 * | 4/2011 | Thiyagarajan et al. | 430/313 |
| 8,105,760 B2 * | 1/2012 | Hatakeyama et al. | 430/315 |
| 8,124,312 B2 * | 2/2012 | Ishikawa et al. | 430/270.1 |
| 2007/0231738 A1 | 10/2007 | Kaneko et al. | |
| 2008/0090172 A1 | 4/2008 | Hatakeyama et al. | |
| 2008/0199814 A1 | 8/2008 | Brzozowy et al. | |
| 2009/0190073 A1 * | 7/2009 | Yoshino et al. | 349/106 |
| 2009/0280440 A1 * | 11/2009 | Tarutani et al. | 430/325 |
| 2010/0003622 A1 | 1/2010 | Matsumaru et al. | |
| 2010/0028803 A1 * | 2/2010 | Sugimoto et al. | 430/270.1 |
| 2010/0028809 A1 | 2/2010 | Vanleenhove et al. | |
| 2010/0035177 A1 | 2/2010 | Ishikawa et al. | |
| 2010/0062379 A1 | 3/2010 | Iwashita | |
| 2010/0183851 A1 * | 7/2010 | Cao et al. | 428/195.1 |
| 2010/0183978 A1 * | 7/2010 | Yoshidome | 430/270.1 |
| 2010/0297554 A1 * | 11/2010 | Watanabe et al. | 430/270.1 |
| 2011/0033799 A1 * | 2/2011 | Watanabe et al. | 430/270.1 |

FOREIGN PATENT DOCUMENTS

| | | | |
|---|---|---|---|
| JP | 2000-336121 A | | 12/2000 |
| JP | 2001166476 A | * | 6/2001 |
| JP | 2005-248169 A | | 9/2005 |
| JP | 2007-297590 A | | 11/2007 |
| JP | 2008-033174 A | | 2/2008 |
| JP | 2008-078220 A | | 4/2008 |
| JP | 2008-083537 A | | 4/2008 |
| JP | 2008-111103 A | | 5/2008 |
| JP | 2008-122932 A | | 5/2008 |
| JP | 2008-192774 A | | 8/2008 |
| WO | 2008/059440 A2 | | 5/2008 |
| WO | 2008/070060 A2 | | 6/2008 |
| WO | 2008/114644 A1 | | 9/2008 |

OTHER PUBLICATIONS

Soichi Owa et al. "Immersion Lithography; its potential performance and issues", Proceedings of SPIE, 2003, p. 724, vol. 5040, Cited in Spec.

Stephen Hsu et al. "Double Exposure Technique for 45nm node and Beyond", Proceedings of SPIE, 2005, p. 59921Q-1-16, vol. 5992, Cited in Spec.

Kuang-Jung Rex Chen et al. "Resist Freezing Process for Double Exposure Lithography", Proceedings of SPIE, 2008, p. 69230G, vol. 6923, Cited in Spec.

Masafumi Hori et al. "Sub-40nm Half-Pitch Double Patterning with Resist Freezing Process", Proceedings of SPIE, 2008, p. 69230H, vol. 6923, Cited in Spec.

Nikolaos Bekiaris et al. "A Lithographic and Process Assessment of Photoresist Stabilization for Double-Patterning using 172 nm Photoresist Curing", Proceedings of SPIE, 2008, p. 692321, vol. 6923, Cited in Spec.

Hiroko Nakamura et al. "Ion implantation as insoluble treatment for resist stacking process", 2008, p. 692322, vol. 6923, Cited in Spec.

Satoru Shimura et al. "Advanced resist process enabling implementation of CD controllability for 32nm and beyond", Proceedings of SPIE, 2008, p. 69233C1, vol. 6923, Cited in Spec.

David J. Abdallah et al. "A Novel Resist Freeze Process for Double Imaging", Journal of Photopolymer Science and Technology, 2008, p. 655, vol. 21, No. 5, Cited in Spec.

* cited by examiner

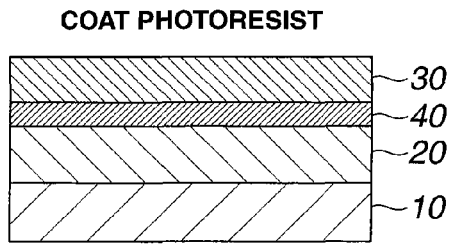
FIG.1A COAT PHOTORESIST
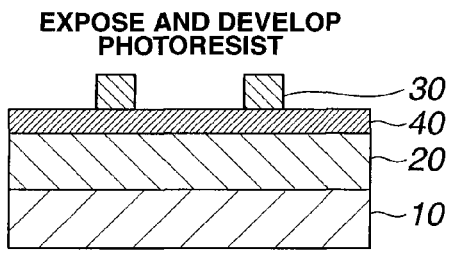
FIG.1B EXPOSE AND DEVELOP PHOTORESIST
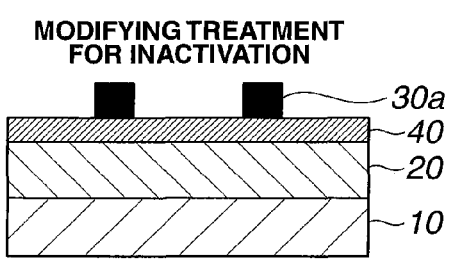
FIG.1C MODIFYING TREATMENT FOR INACTIVATION
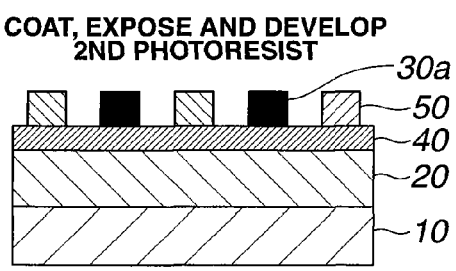
FIG.1D COAT, EXPOSE AND DEVELOP 2ND PHOTORESIST
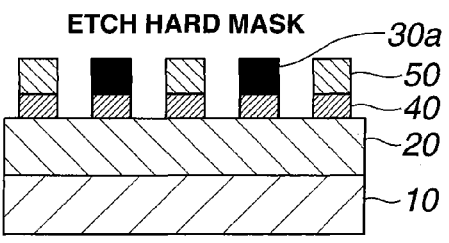
FIG.1E ETCH HARD MASK
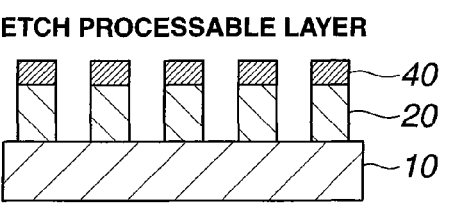
FIG.1F ETCH PROCESSABLE LAYER

FIRST PATTERN

SECOND PATTERN

FIRST PATTERN

SECOND PATTERN

COAT PHOTORESIST

EXPOSE AND DEVELOP PHOTORESIST

ETCH HARD MASK

COAT, EXPOSE AND DEVELOP 2ND PHOTORESIST

ETCH PROCESSABLE LAYER

COAT PHOTORESIST

EXPOSE AND DEVELOP PHOTORESIST

ETCH HARD MASK

COAT, EXPOSE AND DEVELOP 2ND PHOTORESIST

ETCH HARD MASK

ETCH PROCESSABLE LAYER

A (FIRST PATTERN)   B (SECOND PATTERN)

A (FIRST PATTERN)   B (SECOND PATTERN)

RESIST-MODIFYING COMPOSITION AND PATTERN FORMING PROCESS

CROSS-REFERENCE TO RELATED APPLICATION

This non-provisional application claims priority under 35 U.S.C. §119(a) on Patent Application No. 2009-125429 filed in Japan on May 25, 2009, the entire contents of which are hereby incorporated by reference.

TECHNICAL FIELD

This invention relates to a patterning process involving the steps of forming a first resist pattern from a first resist film through first exposure, treating the first resist pattern with a resist-modifying composition for inactivation to a second resist process, coating a second resist composition, and forming a second resist pattern therefrom while retaining the first resist pattern, for thereby forming a fine feature pattern. It also relates to a resist-modifying composition used in the process.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. While a number of light sources are used in the lithography for resist pattern formation, photolithography using ArF excimer laser (193 nm) has been under active investigation over a decade. The full application of ArF lithography started from the 90-nm node. The ArF lithography combined with a lens having an increased numerical aperture (NA) of 0.9 is considered to comply with 65-nm node devices. For the manufacture of next 45-nm node devices, the early introduction of ArF immersion lithography was advocated (see Proc. SPIE Vol. 4690 xxix, 2002).

In the ArF immersion lithography, the space between the projection lens and the wafer is filled with water. Since water has a refractive index of 1.44 at 193 nm, design of a lens having a numerical aperture (NA) of 1.0 or greater is possible in principle. Proposal of a catadioptric system accelerated the lens design to a NA of 1.0 or greater. A combination of a lens having NA of 1.2 or greater with strong resolution enhancement technology suggests a way to the 45-nm node (see Proc. SPIE Vol. 5040, p 724, 2003). Efforts have also been made to develop lenses of NA 1.35.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line edge roughness (LER, LWR) of resist film, defect-free MoSi laminate mask, reduced aberration of reflection mirror, and the like.

The water immersion lithography using a NA 1.35 lens achieves an ultimate resolution of 40 to 38 nm at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5O_{12}$) having a refractive index of at least 2 is the most promising material, but has the problems of birefringence and noticeable absorption. Even if a projection lens material with a refractive index of 1.8 or greater is developed, the liquid with a refractive index of 1.65 limits the NA to 1.55 at most, failing in resolution of 32 nm. For resolution of 32 nm, a liquid with a refractive index of 1.8 or greater is necessary. Such a liquid material has not been discovered because a tradeoff between absorption and refractive index is recognized in the art. In the case of alkane compounds, bridged cyclic compounds are preferred to linear ones in order to increase the refractive index, but the cyclic compounds undesirably have too high a viscosity to follow high-speed scanning on the exposure tool stage. If a liquid with a refractive index of 1.8 is developed, then the component having the lowest refractive index is the resist film, suggesting a need to increase the refractive index of a resist film to 1.8 or higher.

The process that now draws attention under the above-discussed circumstances is a double patterning process involving a first set of exposure and development to form a first pattern and a second set of exposure and development to form a pattern in spaces of the first pattern. See Proc. SPIE Vol. 5992, 59921Q-1-16 (2005). A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure pattern, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a second photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. However, since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern, or a RELACS method of coating a water-soluble film on the trench pattern as developed and heating to thicken the resist for achieving shrinkage of the trench pattern. These have the drawbacks that the proximity bias is degraded and the process is further complicated, leading to reduced throughputs.

Both the former and latter processes require two etchings for substrate processing, leaving the issues of a reduced throughput and deformation and misregistration of the pattern by two etchings.

One method that proceeds with a single etching is by using a negative resist material in a first exposure and a positive resist material in a second exposure. Another method is by using a positive resist material in a first exposure and a negative resist material in an alcohol that does not dissolve away the positive resist material in a second exposure. Since negative resist materials with low resolution are used, these methods entail degradation of resolution (see JP-A 2008-078220).

The critical issue associated with double patterning is an overlay accuracy between first and second patterns. Since the magnitude of misregistration is reflected by a variation of line size, an attempt to form 32-nm lines at an accuracy of 10%, for example, requires an overlay accuracy within 3.2 nm. Since currently available scanners have an overlay accuracy of the order of 8 nm, a significant improvement in accuracy is necessary.

Now under investigation is the resist pattern freezing technology involving forming a first resist pattern on a substrate, taking any suitable means for inactivating the resist pattern to a second resist process, applying a second resist thereon, and forming a second resist pattern in space portions of the first resist pattern. With this freezing technology, etching of the substrate is required only once, leading to improved throughputs and avoiding the problems of pattern deformation and misregistration due to stresses in the hard mask during etching.

With respect to the freezing technology, one basic idea is proposed in WO 2008/059440. Known variants of the freezing technology include thermal insolubilization (Proc. SPIE Vol. 6923, p69230G (2008)); coating of a cover film and thermal insolubilization (Proc. SPIE Vol. 6923, p69230H (2008)); insolubilization by illumination of light having an extremely short wavelength, for example, 172 nm wavelength (Proc. SPIE Vol. 6923, p692321 (2008)); insolubilization by ion implantation (Proc. SPIE Vol. 6923, p692322 (2008)); insolubilization through formation of thin-film oxide film by CVD; insolubilization by light illumination and special gas treatment (Proc. SPIE Vol. 6923, p69233C1 (2008)); insolubilization of a resist pattern by treatment of resist pattern surface with a metal alkoxide or metal halide (e.g., titanium, zirconium or aluminum) or an isocyanate-containing silane compound (JP-A 2008-033174); insolubilization of a resist pattern by coating its surface with a water-soluble resin and a water-soluble crosslinker (JP-A 2008-083537); insolubilization by ethylene diamine gas and baking (J. Photopolym. Sci. Technol., Vol. 21, No. 5, p 655 (2008)); insolubilization by coating of an amine-containing solution and hard-baking for crosslinking (WO 2008/070060); and insolubilization of resist pattern by treatment with a mixture of a polar resin containing amide or analogous groups and a crosslinker (WO 2008/114644).

JP-A 2008-192774 discloses a method including insolubilizing a first resist pattern by application of radiation and heat, coating the insolubilized pattern with a resist solution comprising a base polymer comprising recurring units having hexafluoroalcohol groups and acid labile groups in an alcohol solvent, and forming a second resist pattern therefrom.

These insolubilizing techniques have many problems including deformations (film-slimming, size-narrowing and size-widening) of the first resist pattern during the steps of first resist pattern inactivation and second patterning. It would be desirable to have a material and process capable of retaining the first resist pattern without deformation until the end of second patterning.

Citation List

Patent Document 1: JP-A 2008-078220
Patent Document 2: WO 2008/059440
Patent Document 3: JP-A 2008-033174
Patent Document 4: JP-A 2008-083537
Patent Document 5: WO 2008/070060
Patent Document 6: WO 2008/114644
Patent Document 7: JP-A 2008-192774
Non-Patent Document 1: Proc. SPIE Vol. 4690, xxix, 2002
Non-Patent Document 2: Proc. SPIE Vol. 5040, p724, 2003
Non-Patent Document 3: Proc. SPIE Vol. 5992, 59921Q-1-16, 2005
Non-Patent Document 4: Proc. SPIE Vol. 6923, p69230G (2008)
Non-Patent Document 5: Proc. SPIE Vol. 6923, p69230H (2008)
Non-Patent Document 6: Proc. SPIE Vol. 6923, p692321 (2008)
Non-Patent Document 7: Proc. SPIE Vol. 6923, p692322 (2008)
Non-Patent Document 8: Proc. SPIE Vol. 6923, p69233C1 (2008)
Non-Patent Document 9: J. Photopolym. Sci. Technol., Vol. 21, No. 5, p655 (2008)

SUMMARY OF INVENTION

It is understood that when substrate processing is carried out by double dry etchings using resist patterns fabricated by double exposures and developments, the throughput is reduced to one half. Also an issue of pattern misregistration by dry etchings occurs. While the number of dry etching steps can be reduced to one by applying prior art resist pattern insolubilizing techniques, these techniques are still difficult to retain the first pattern satisfactory.

Therefore, an object of the invention is to provide a pattern forming process in order to enable a double patterning process of processing a substrate by a single dry etching; specifically a pattern forming process comprising coating a first positive resist composition comprising a copolymer comprising recurring units having lactone as an adhesive group and recurring units having an acid labile group, effecting first exposure and development to form a first resist pattern, treating the first resist pattern with a resist-modifying composition for inactivating the first resist pattern to a second resist process, then implementing the second resist process to form a second resist pattern in spaces of the first resist pattern, for thereby forming a fine feature pattern of satisfactory profile which is difficult to produce by single patterning. Another object of the invention is to provide a resist-modifying composition for use in the pattern forming process.

The invention pertains to a pattern forming process comprising at least the steps of:

(1) coating a first positive resist composition comprising a polymer comprising recurring units adapted to increase alkali solubility under the action of acid and recurring units having lactone structure onto a substrate and baking to form a first resist film, exposing the first resist film to high-energy radiation, post-exposure baking, and developing the first resist film with an alkaline developer to form a first resist pattern, (2) applying a resist-modifying composition to the first resist pattern and heating to modify the first resist pattern, and (3) coating a second positive resist composition thereon and baking to form a second resist film, exposing the second resist film to high-energy radiation, post-exposure baking, and developing the second resist film with an alkaline developer to form a second resist pattern.

In one aspect, the invention provides the resist-modifying composition used in the pattern forming process, comprising a base resin and an alcohol-based solvent. The base resin is a polymer comprising recurring units having the general formula (1):

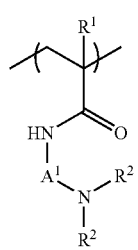

(1)

wherein $A^1$ is a straight, branched or cyclic $C_2$-$C_8$ alkylene group which may contain an ether group, $R^1$ is hydrogen or methyl, $R^2$ is each independently a $C_1$-$C_4$ alkyl group or two $R^2$ may bond together to form a $C_4$-$C_{10}$ heterocycle with the nitrogen atom to which they are attached.

In a preferred embodiment, the polymer as the base resin further comprises recurring units having the general formula (2):

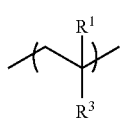

(2)

wherein $R^1$ is hydrogen or methyl, and $R^3$ is a $C_6$-$C_{15}$ aryl group, $C_3$-$C_{10}$ hetero-aryl group, or $C_4$-$C_6$ lactam group.

More preferably, $A^1$ in formula (1) is ethylene or trimethylene, $R^2$ in formula (1) is methyl or ethyl, and $R^3$ in formula (2) is a $C_4$-$C_6$ lactam group.

The resist-modifying composition may further comprise a crosslinker, more preferably a water-insoluble crosslinker having the general formula (3) or (4):

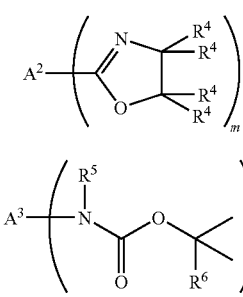

(3)

(4)

wherein m is each independently an integer of 2 to 6, $A^2$ is a single bond, m-valent $C_1$-$C_{20}$ hydrocarbon group, or m-valent $C_6$-$C_{15}$ aromatic group, $A^3$ is a m-valent $C_2$-$C_{20}$ hydrocarbon group which may contain a hydroxyl or ether group, $R^4$ is each independently hydrogen or methyl, $R^5$ is hydrogen or a $C_1$-$C_4$ alkyl group, and $R^6$ is methyl or ethyl.

In another aspect, the invention provides the pattern forming process wherein step (2) uses the resist-modifying composition defined above.

ADVANTAGEOUS EFFECTS OF INVENTION

Through the modifying treatment according to the invention, the first resist pattern is so inactivated that it may be retained even after second patterning. The pattern forming process and the resist-modifying composition of the invention make it possible to implement a double patterning process of processing a substrate by two exposures and a single dry etching.

BRIEF DESCRIPTION OF DRAWINGS

FIG. 1 is a cross-sectional view of a double patterning process according to one embodiment of the invention. FIG. 1A shows a laminate of substrate, processable layer, hard mask and first resist film, FIG. 1B shows the first resist film being exposed and developed, FIG. 1C shows the first resist film being modified for inactivation, FIG. 1D shows a second resist film being formed, exposed and developed, FIG. 1E shows the hard mask being etched, and FIG. 1F shows the processable layer being etched.

FIG. 2 is a schematic view of a double patterning process according to another embodiment of the invention.

FIG. 3 is a schematic view of a double patterning process according to a further embodiment of the invention.

FIG. 4 is a cross-sectional view of an exemplary prior art double patterning process.

FIG. 5 is a cross-sectional view of another exemplary prior art double patterning process.

FIG. 6 is a cross-sectional view of a further exemplary prior art double patterning process.

DESCRIPTION OF THE PREFERRED EMBODIMENT

Figure 2A:
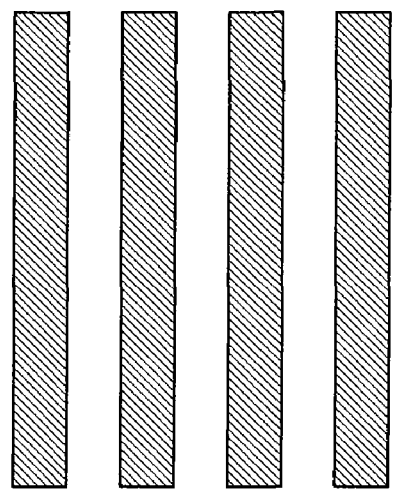
FIG. 2A shows a first resist pattern being formed.

The singular forms "a," "an" and "the" include plural references unless the context clearly dictates otherwise.

"Optional" or "optionally" means that the subsequently described event or circumstance may or may not occur, and that the description includes instances where the event occurs and instances where it does not.

As used herein, the notation ($C_n$-$C_m$) means a group containing from n to m carbon atoms per group.

As used herein, the term "film" is used interchangeably with "coating" or "layer."

The term "processable layer" is interchangeable with patternable layer and refers to a target layer that can be processed such as by etching to form a pattern therein.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure baking
TMAH: tetramethylammonium hydroxide
PGMEA: propylene glycol monomethyl ether acetate In connection with the double patterning lithography involving double exposures and developments to form a fine feature pattern, the inventors made efforts to develop a resist-modifying composition which enables to process a substrate by a single dry etching and a patterning process using the same.

The inventors have discovered that a double patterning process can be practiced by coating a first positive resist composition comprising a copolymer comprising recurring units having lactone as an adhesive group and recurring units having an acid labile group, effecting first exposure and development to form a first resist pattern, treating the first resist pattern with a resist-modifying composition comprising a base resin of a specific structure and an alcohol-based solvent for inactivating the first resist pattern to a second resist process, then implementing the second resist process to form a second resist pattern in spaces of the first resist pattern without a loss of the first resist pattern, for thereby eventually forming a fine feature pattern of satisfactory profile while reducing the distance between pattern features. Then the substrate can be processed by a single dry etching. The present invention is predicated on this discovery.

Prior art methods for insolubilizing the first resist pattern using resist insolubilizing agents proposed thus far suffer from many problems including insufficient retention of the first resist pattern, and deformations (film-slimming, size-narrowing and size-widening) of the first resist pattern during the steps of first resist pattern inactivation and second patterning. A resist-modifying composition comprising a base resin having recurring units having both amine and amide structures and an alcohol-based solvent allows for sufficient retention of the first resist pattern throughout the pattern forming process.

Resist-modifying Composition

The resist-modifying composition is defined herein as comprising a base resin and an alcohol-based solvent. The base resin is a polymer comprising recurring units having the general formula (1).

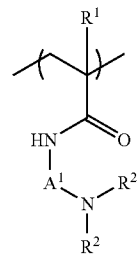

(1)

Herein $A^1$ is a straight, branched or cyclic $C_2$-$C_8$ alkylene group which may contain an ether group, $R^1$ is hydrogen or methyl, $R^2$ is each independently a $C_1$-$C_4$ alkyl group or two $R^2$ may bond together to form a $C_4$-$C_{10}$ heterocycle with the nitrogen atom to which they are attached.

Specifically, $A^1$ is a straight, branched or cyclic $C_2$-$C_8$ alkylene group which may contain an ether group. Illustrative examples of $A^1$ include, but are not limited to, ethylene, propylene, butylene, trimethylene, tetramethylene, pentamethylene, octamethylene, 1,2-cyclopentylene, 1,3-cyclopentylene, 1,3-cyclohexylene, norbornanediyl, 3-oxapentane-1,5-diyl, and 3,6-dioxaoctane-1,8-diyl, with ethylene and trimethylene being most preferred. $R^1$ is hydrogen or methyl, with methyl being most preferred. $R^2$ is each independently a $C_1$-$C_4$ alkyl group or two $R^2$ may bond together to form a $C_4$-$C_{10}$ heterocycle with the nitrogen atom to which they are attached. Examples of the $C_1$-$C_4$ alkyl group represented by $R^2$ include methyl, ethyl, propyl, isopropyl, butyl, s-butyl, t-butyl and isobutyl. Examples of the heterocycle formed by $R^2$ bonding together include pyrrolidine, piperazine, morpholine, azacyclooctane, and azacyclodecane rings. Most preferably $R^2$ is methyl or ethyl. Recurring units of formula (1) may be of one type or a mixture of two or more types.

The recurring units of formula (1) contain a tertiary amine structure which has so high a basicity that it may undergo acid-base reaction with acidic groups (typically carboxyl groups) present in the first resist pattern subsurface layer. By virtue of this reaction, the tertiary amine structure is believed to contribute to selective adsorption of the base resin in the resist-modifying composition to the first resist pattern subsurface layer. In addition, the tertiary amine structure makes another contribution in preventing any damage to the first pattern by exposure during the second patterning step, since it acts to inactivate the acid which is generated by a photoacid generator in the first pattern when the first pattern after modifying treatment is exposed during the second patterning step. The recurring units of formula (1) also contain a secondary amide structure which is so polar and hydrophilic that it may reduce the affinity of the base resin in the resist-modifying composition and, in turn, the first pattern after modifying treatment to ordinary resist solvents such as PGMEA. The secondary amide structure is believed to protect the first pattern from a solvent attack during the step of coating the second resist composition. While it is desirable for the purposes of preventing deformation of the first pattern and reducing defects in the first pattern that the base resin remaining in excess after modifying treatment be fully removed by washing with water or developer, the presence of highly hydrophilic secondary amide structure is believed to make a significant contribution in improving the water solubility of the base resin and facilitating to wash away the base resin.

Illustrative examples of the recurring unit of formula (1) are given below, but not limited thereto.

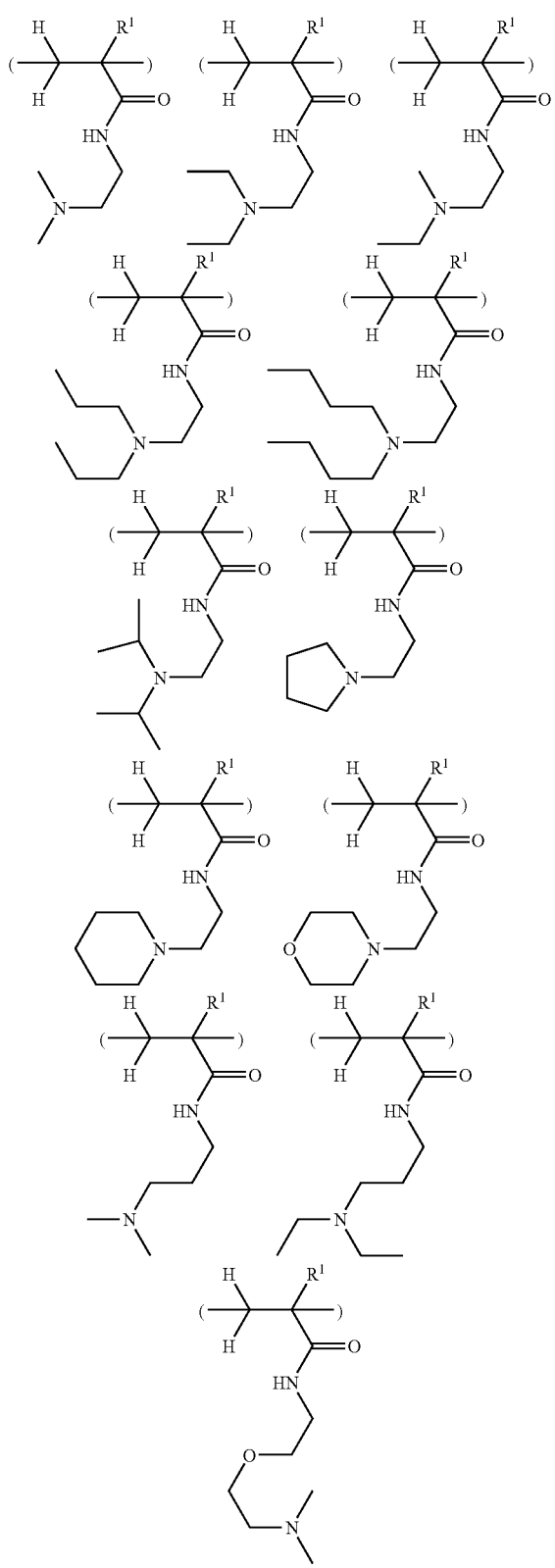

Herein $R^1$ is hydrogen or methyl.

The solvent used in the resist-modifying composition is preferably an alcohol-based solvent. As used herein, the term "alcohol-based solvent" refers to alkanols of 3 to 8 carbon atoms and mixtures of solvents based on the alkanol, that is, containing at least 50% by weight of the alkanol based on the entire solvents. The solvent used in the resist-modifying composition should have the nature that the first resist pattern does not substantially dissolve therein. In this regard, alkanols of 1 to 8 carbon atoms, ethers of 6 to 12 carbon atoms, alkanes, alkenes and aromatic hydrocarbons of 6 to 16 carbon atoms, and water are preferred. The solvent used in the resist-modifying composition should also have the nature that the base resin of the resist-modifying composition fully dissolves therein to enable uniform coating. In this regard, alkanols of 3 to 8 carbon atoms are preferred among the foregoing candidates. Those alkanols of 3 to 8 carbon atoms may be used alone or as a solvent mixture based thereon. On use of a solvent mixture, solvents which can be used in admixture include alkanols of 1 to 8 carbon atoms, ethers of 6 to 12 carbon atoms, alkanes, alkenes and aromatic hydrocarbons of 6 to 16 carbon atoms. Where water is used as the main solvent, a composition may be poor in coating operation and storage stability (e.g., propagation of bacteria). As compared with alkanols of 3 to 8 carbon atoms alone, a mixture of an alkanol of 3 to 8 carbon atoms and water may cause a stronger solvent attack to the first pattern during coating of the resist-modifying composition, inviting substantial deformation of the first pattern. Where water is used as the main solvent in the resist-modifying composition, undesirably a separate applicator must be installed to coat the resist-modifying composition because the use of the existing resist and topcoat applicator line is prohibited by a risk of resin precipitation associated with chemical liquid exchange.

Suitable alkanols of 3 to 8 carbon atoms include n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol. Those alkanols of 1 to 2 carbon atoms are methanol and ethanol. Suitable ethers of 6 to 12 carbon atoms include methyl cyclopentyl ether, methyl cyclohexyl ether, anisole, diisopropyl ether, diisobutyl ether, diisopentyl ether, di-n-pentyl ether, methyl cyclopentyl ether, methyl cyclohexyl ether, di-n-butyl ether, di-sec-butyl ether, diisopentyl ether, di-sec-pentyl ether, di-tert-amyl ether, and di-n-hexyl ether. Suitable alkanes of 6 to 16 carbon atoms include hexane, octane, decane, cyclohexane, cycloheptane, cyclooctane, cyclodecane, methylcyclohexane, dimethylcyclohexane, methyladamantane, dimethyladamantane, and decahydronaphthalene. Suitable aromatic hydrocarbons include benzene, toluene and xylene. Of these, preferred are isobutyl alcohol, 2-methyl-1-butanol, 3-methyl-1-butanol, butanol, and solvent mixtures based on any of the foregoing.

In the resist-modifying composition, the solvent may be used preferably in an amount of 1,000 to 100,000 parts, and more preferably 2,000 to 50,000 parts by weight per 100 parts by weight of the base resin comprising recurring units of formula (1).

Preferably the polymer as the base resin in the resist-modifying composition may comprise recurring units of the general formula (2) in addition to the recurring units of formula (1).

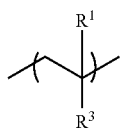
(2)

Herein $R^1$ is hydrogen or methyl, and $R^3$ is a $C_6$-$C_{15}$ aryl group, $C_3$-$C_{10}$ hetero-aryl group, or $C_4$-$C_6$ lactam group.

More particularly, $R^1$ is hydrogen or methyl. $R^3$ is a $C_6$-$C_{15}$ aryl group, a $C_3$-$C_{10}$ hetero-aryl group, or a $C_4$-$C_6$ lactam group. Examples of the $C_6$-$C_{15}$ aryl group include phenyl, tolyl, xylyl, naphthyl, anthranyl, 3-hydroxyphenyl, 4-hydroxyphenyl, 4-methoxyphenyl, 4-acetoxyphenyl, 4-t-butoxyphenyl, 4-carboxyphenyl, 4-sulfophenyl, 2-[2,2,2-trifluoro-1-hydroxy-1-(trifluoromethyl)ethyl]phenyl, 3-[2,2,2-trifluoro-1-hydroxy-1-(trifluoromethyl)ethyl]phenyl, 4-[2,2,2-trifluoro-1-hydroxy-1-(trifluoromethyl)ethyl]phenyl, and 3,5-bis[2,2,2-trifluoro-1-hydroxy-1-(trifluoromethyl)-ethyl] phenyl. Examples of the $C_3$-$C_{10}$ hetero-aryl group include 1-imidazolyl, 2-oxazolinyl, 2-furyl, 2-thienyl, 1-pyrrolyl, 2-pyridyl, 4-pyridyl, and 2-quinolyl. Examples of the $C_4$-$C_6$ lactam group include 2-oxo-1-piperidinyl, 2-oxopiperidino, and 2-oxo-1-azacycloheptyl. More preferably $R^3$ is a $C_4$-$C_6$ lactam group. It is preferred mainly for storage stability that $R^3$ be free of an ester group.

It is preferable to incorporate recurring units of formula (2) into the base resin in the resist-modifying composition as well as recurring units of formula (1) because many properties of the base resin including solubility in organic solvents, hydrophilicity, water solubility, basicity, affinity to the first resist pattern, and coating efficiency can then be tailored in accordance with a particular application. In the base resin, the recurring units of formula (1) are preferably present in a molar fraction of 10 to 100%, more preferably 30 to 90%, and the recurring units of formula (2) are preferably present in a molar fraction of 0 to 90%, more preferably 10 to 70% based on the entire recurring units.

Besides the recurring units of formulae (1) and (2), the base resin in the resist-modifying composition may further comprise additional recurring units. The additional recurring units which can be incorporated into the base resin are not particularly limited as long as they are copolymerizable with the recurring units of formulae (1) and (2) to form a copolymer which is stable in the resist-modifying composition. Examples of the additional recurring units are given below.

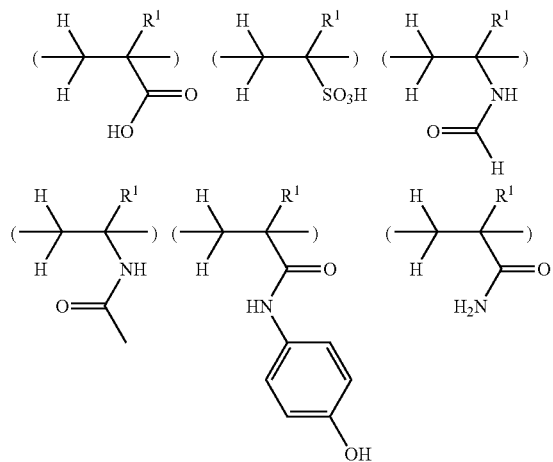

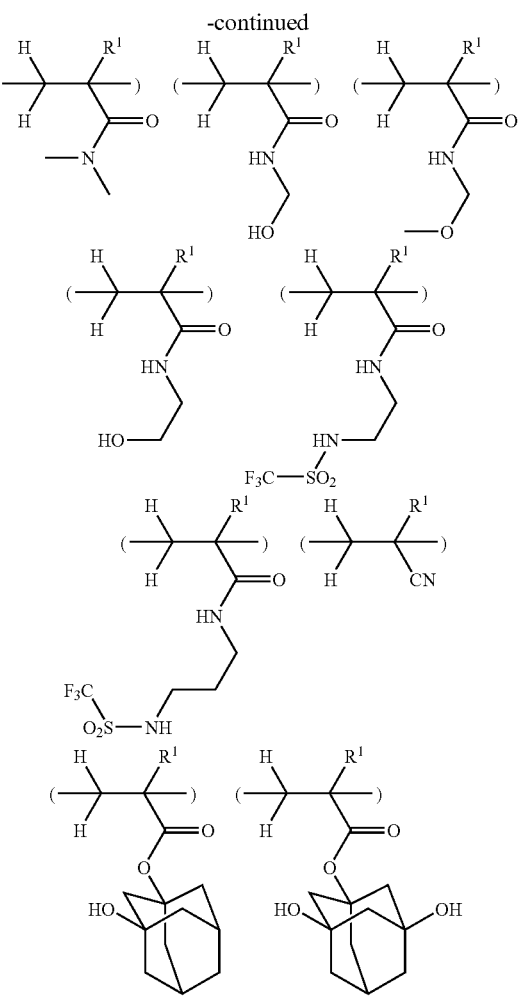

Herein $R^1$ is hydrogen or methyl.

In the base resin, the additional recurring units are preferably present in a molar fraction of 0 to 90%, more preferably 0 to 60% based on the entire recurring units.

The base resin preferably has a weight average molecular weight (Mw) of 1,000 to 500,000, and more preferably 2,000 to 100,000 as measured by GPC versus poly(methyl methacrylate) standards. If Mw of the base resin is too low, the first pattern may be dissolved or deformed when the resist-modifying composition is coated thereon, that is, the first pattern may not be fully retained. If Mw of the base resin is too high, an excess base resin may be left after modifying treatment, resulting in the first pattern being deformed or becoming more defective.

No particular limits are imposed on the synthesis of the foregoing polymers as the base resin in the resist-modifying composition. Any standard methods are applicable. One exemplary method is by dissolving polymerizable unsaturated bond-containing monomers corresponding to the respective recurring units defined above in a solvent, adding a polymerization initiator, typically radical polymerization initiator thereto, and effecting polymerization. Polymerization in a solventless system is also possible. Suitable solvents used in polymerization include toluene, benzene, tetrahydrofuran, diethyl ether, dioxane, 2-butanone, γ-butyrolactone, 1-methoxy-2-propyl acetate, water, alkanols of 1 to 8 carbon atoms as mentioned above, and mixtures of these solvents. Suitable radical polymerization initiators include 2,2'-azobisisobutyronitrile (AIBN), 2,2'-azobis(2,4-dimethylvaleronitrile), dimethyl 2,2-azobis(2-methylpropionate), benzoyl peroxide, lauroyl peroxide, and hydrogen peroxide. Preferably the system is heated at 40° C. to the boiling point of the solvent for polymerization to take place. The reaction time is generally 1 to 100 hours, preferably 3 to 20 hours. Polymerization may be initiated by light irradiation instead of adding a polymerization initiator. The polymer serving as the base resin is not limited to one type, and two or more polymers may be added to the resist-modifying composition. The use of plural polymers allows for adjustment of properties of the resist-modifying composition.

In a preferred embodiment, the resist-modifying composition further comprises a crosslinker, more preferably a water-insoluble crosslinker having the general formula (3) or (4).

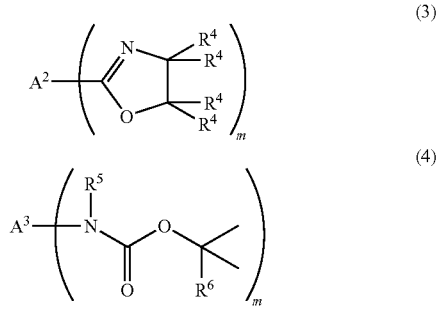

Herein m is each independently an integer of 2 to 6, $A^2$ is a single bond, m-valent $C_1$-$C_{20}$ hydrocarbon group, or m-valent $C_6$-$C_{15}$ aromatic group, $A^3$ is a m-valent $C_2$-$C_{20}$ hydrocarbon group which may contain a hydroxyl or ether group, $R^4$ is each independently hydrogen or methyl, $R^5$ is hydrogen or a $C_1$-$C_4$ alkyl group, and $R^6$ is methyl or ethyl.

Compounding of the crosslinker in the resist-modifying composition contributes to a full inactivation of the first resist pattern in that the crosslinker is adsorbed to or mixed with the first resist pattern during modifying treatment, and crosslinking reaction occurs between the base resins in the first resist film and the resist-modifying composition and the crosslinker during subsequent heating. As a result, the first resist pattern subsurface layer is increased in molecular weight and endowed with more solvent resistance. The preferred crosslinker used herein is a water-insoluble crosslinker. If a water-soluble crosslinker is used, then the progress of crosslinking reaction leading to inactivation of the first pattern is retarded because the water-soluble crosslinker is less penetrative to the first pattern due to its low affinity to the highly hydrophobic resist polymer.

In the resist-modifying composition, the crosslinker is preferably compounded in an amount of 5 to 1,000 parts by weight, more preferably 10 to 500 parts by weight per 100 parts by weight of the base resin.

In formula (3), m is an integer of 2 to 6, with m=2 being most preferred. $A^2$ is a single bond, m-valent $C_1$-$C_{20}$ hydrocarbon group, or m-valent $C_6$-$C_{15}$ aromatic group. Examples of the m-valent $C_1$-$C_{20}$ hydrocarbon group include methane, ethane, propane, butane, isobutane, pentane, isopentane, neopentane, cyclopentane, hexane, cyclohexane, methylcyclohexane, dimethylcyclohexane, norbornane, methylnorbornane, decalin, adamantane, decane, pentadecane, and dimethanodecahydronaphthalene, with a number "m" of hydrogen atoms being eliminated. Examples of the m-valent $C_6$-$C_{15}$ aromatic group include benzene, toluene, xylene, mesitylene, cumene, naphthalene, biphenyl, anthracene, and phenanthrene, with a number "m" of hydrogen atoms being eliminated. Preferably, $A^2$ is a single bond, ethylene, 1,3-phenylene or 1,4-phenylene. $R^4$ is each independently hydrogen or methyl, with hydrogen being most preferred. Examples of the crosslinker having formula (3) include, but are not limited to, 2,2'-bis(2-oxazoline), 2,2'-ethylenebis(2-oxazoline), 2,2'-(1,3-phenylene)bis(2-oxazoline), and 2,2'-(1,4-phenylene)bis(2-oxazoline).

In formula (4), m is an integer of 2 to 6, with m=2 or 3 being most preferred. $A^3$ is a m-valent $C_2$-$C_{20}$ hydrocarbon group which may contain a hydroxyl or ether group. Examples of the m-valent $C_2$-$C_{20}$ hydrocarbon group include ethane, propane, butane, isobutane, pentane, isopentane, neopentane, cyclopentane, hexane, cyclohexane, methylcyclohexane, dimethylcyclohexane, norbornane, methylnorbornane, decalin, adamantane, decane, pentadecane, dimethanodecahydronaphthalene, icosane, 2-propanol, and diethyl ether, with a number "m" of hydrogen atoms being eliminated. Preferred are ethylene, propylene, butylene, trimethylene, tetramethylene, pentamethylene, hexamethylene, octamethylene, and 1,2,3-propanetriyl. $R^5$ is hydrogen or a $C_1$-$C_4$ alkyl group, examples of which include methyl, ethyl, propyl, isopropyl, butyl, s-butyl, t-butyl, and isobutyl. Preferably $R^5$ is hydrogen or methyl. $R^6$ is methyl or ethyl, with methyl being preferred. Examples of the crosslinker having formula (4) are given below, but not limited thereto.

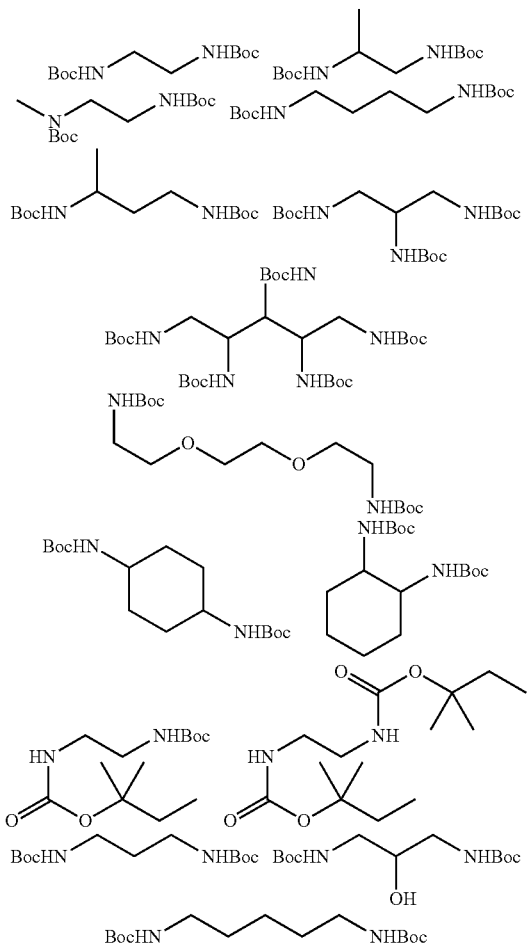

-continued

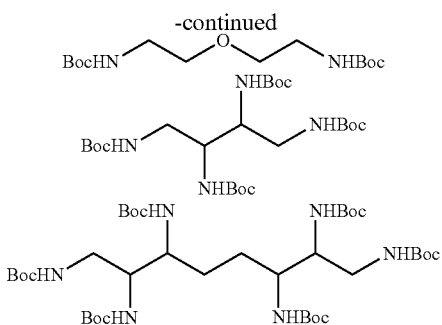

Herein Boc is t-butoxycarbonyl.

The crosslinkers having formulae (3) and (4) may be used alone or in admixture of two or more. A crosslinker other than the crosslinkers having formulae (3) and (4) may be contained in the resist-modifying composition. The other crosslinker is preferably a nitrogen-containing crosslinker. The nitrogen-containing crosslinker used herein is not particularly limited and may be selected from a wide variety of well-known crosslinkers. Suitable nitrogen-containing crosslinkers include melamine, glycoluril, benzoguanamine, urea, β-hydroxyalkylamide, isocyanurate, aziridine, and amine crosslinkers.

Suitable melamine crosslinkers include hexamethoxymethylated melamine, hexabutoxymethylated melamine, and alkoxy and/or hydroxy-substituted derivatives thereof, and partial self-condensates thereof. Suitable glycoluril crosslinkers include tetramethoxymethylated glycoluril, tetrabutoxymethylated glycoluril, and alkoxy and/or hydroxy-substituted derivatives thereof, and partial self-condensates thereof. Suitable benzoguanamine crosslinkers include tetramethoxymethylated benzoguanamine, tetrabutoxymethylated benzoguanamine, and alkoxy and/or hydroxy-substituted derivatives thereof, and partial self-condensates thereof. Suitable urea crosslinkers include dimethoxymethylated dimethoxyethyleneurea, and alkoxy and/or hydroxy-substituted derivatives thereof, and partial self-condensates thereof. A typical β-hydroxyalkylamide crosslinker is N,N,N',N'-tetra(2-hydroxyethyl)adipic acid amide. Suitable isocyanurate crosslinkers include triglycidyl isocyanurate and triallyl isocyanurate. Suitable aziridine crosslinkers include 4,4'-bis(ethyleneiminocarbonylamino)diphenylmethane and 2,2-bishydroxymethylbutanol-tris[3-(1-aziridinyl)propionate].

Suitable amine crosslinkers include compounds having a plurality of amino groups such as ethylenediamines. Examples of ethylenediamines include, but are not limited to, ethylenediamine, 1,2-diaminopropane, 1,2-diamino-2-methylpropane, N-methylethylenediamine, N-ethylethylenediamine, N-isopropylethylenediamine, N-hexylethylenediamine, N-cyclohexylethylenediamine, N-octylethylenediamine, N-decylethylenediamine, N-dodecylethylenediamine, N,N-dimethylethylenediamine, N,N-diethylethylenediamine, N,N'-diethylethylenediamine, N,N'-diisopropylethylenediamine, N,N,N'-trimethylethylenediamine, diethylenetriamine, N-isopropyldiethylenetriamine, N-(2-aminoethyl)-1,3-propanediamine, triethylenetetramine, N,N'-bis(3-aminopropyl)ethylenediamine, N,N'-bis(2-aminoethyl)-1,3-propanediamine, tris(2-aminoethyl)amine, tetraethylenepentamine, pentaethylenehexamine, 2-(2-aminoethylamino)ethanol, N,N'-bis(hydroxyethyl)ethylenediamine, N-(hydroxyethyl)diethylenetriamine, N-(hydroxyethyl)triethylenetetramine, piperazine, 1-(2-aminoethyl)piperazine, 4-(2-aminoethyl)morpholine, and polyethyleneimine. Diamines other than the ethylenediamines and polyamines are also useful. Exemplary other diamines and polyamines include, but are not limited to, 1,3-diaminopropane, 1,4-diaminobutane, 1,3-diaminopentane, 1,5-diaminopentane, 2,2-dimethyl-1,3-propanediamine, hexamethylenediamine, 2-methyl-1,5-diaminopropane, 1,7-diaminoheptane, 1,8-diaminooctane, 2,2,4-trimethyl-1,6-hexanediamine, 2,4,4-trimethyl-1,6-hexanediamine, 1,9-diaminononane, 1,10-diaminodecane, 1,12-diaminododecane, N-methyl-1,3-propanediamine, N-ethyl-1,3-propanediamine, N-isopropyl-1,3-propanediamine, N,N-dimethyl-1,3-propanediamine, N,N'-dimethyl-1,3-propanediamine, N,N'-diethyl-1,3-propanediamine, N,N'-diisopropyl-1,3-propanediamine, N,N,N'-trimethyl-1,3-propanediamine, 2-butyl-2-ethyl-1,5-pentanediamine, N,N'-dimethyl-1,6-hexanediamine, 3,3'-diamino-N-methyldipropylamine, N-(3-aminopropyl)-1,3-propanediamine, spermidine, bis(hexamethylene)triamine, N,N',N''-trimethylbis(hexamethylene)triamine, 4-aminomethyl-1,8-octanediamine, N,N'-bis(3-aminopropyl)-1,3-propanediamine, spermine, 4,4'-methylenebis(cyclohexylamine), 1,2-diaminocyclohexane, 1,4-diaminocyclohexane, 1,3-cyclohexanebis(methylamine), 1,4-cyclohexanebis(methylamine), 1,2-bis(aminoethoxy)ethane, 4,9-dioxa-1,12-dodecanediamine, 4,7,10-trioxa-1,13-tridecanediamine, 1,3-diaminohydroxypropane, 4,4'-methylenedipiperidine, 4-(aminomethyl)piperidine, 3-(4-aminobutyl)piperidine, and polyallylamine.

The other crosslinkers may be used alone or in admixture of two or more, or in combination with one or more crosslinkers having formulae (3) and (4).

In one preferred embodiment of the invention, the resist-modifying composition may comprise a basic compound as well as the base resin, the alcohol-based solvent, and the crosslinker. Upon patternwise exposure of the second resist film to radiation, the first resist pattern is also exposed to radiation. Even in a situation where the first resist pattern is not dissolved in the second resist composition and intermixing with the first resist pattern or dissolution of the first resist pattern during coating of the second resist composition is prevented, the acid generated in the first resist pattern upon exposure of the second resist film acts to promote deprotection reaction in the first resist pattern, resulting in the first resist pattern being dissolved away after development of the second resist film. If a basic compound is present in the first resist pattern and in excess relative to the acid generated upon second exposure, then it neutralizes the acid generated upon exposure of the second resist film, restraining deprotection reaction in the first resist pattern and eventually preventing the first resist pattern from being dissolved away during development of the second resist film. Usually, a quencher in the form of a basic compound is added to photoresist material for the purposes of increasing contrast and suppressing acid diffusion, but in a smaller amount than the acid generator. In order that a basic compound be available in a larger amount than the amount of the acid generated by the acid generator in the first resist pattern upon second exposure, it is contemplated to supply a basic compound after the first resist pattern is formed by development.

In the resist-modifying composition, the basic compound is preferably blended in an amount of 10 to 400 parts and more preferably 20 to 200 parts by weight per 100 parts by weight of the base resin. Too much amounts of the basic compound may result in the second resist pattern of a footing profile.

Examples of the basic compound which can be used herein include primary, secondary, and tertiary aliphatic amines, mixed amines, aromatic amines, heterocyclic amines, imines, nitrogen-containing compounds with carboxyl group, nitrogen-containing compounds with sulfonyl group, nitrogen-containing compounds with hydroxyl group, nitrogen-containing compounds with hydroxyphenyl group, and alcoholic nitrogen-containing compounds. Besides, in some cases, the nitrogen-containing crosslinker and the base resin itself may act as the basic compound. The preferred basic compounds for inactivating acid are high basicity compounds. Since a dissociation constant (pKa) of a conjugate acid is often used as an index of basicity, the preferred compounds have a pKa value of at least 2, more preferably at least 4.

In a more preferred embodiment of the invention, the resist-modifying composition may comprise an aminosilane compound as the basic compound as well as the base resin, the alcohol-based solvent, and the crosslinker. Specifically the basic compound is an aminosilane compound having the general formula (S0) shown below. The aminosilane compound of formula (S0) contributes to inactivation in that in addition to the neutralization effect of the generated acid described above, it adsorbs to or mixes with the surface of the first resist pattern upon coating of the modifying composition, and forms siloxane bonds by itself upon heating or the like, to form crosslinks, thereby modifying the first resist pattern subsurface layer to improve its solvent resistance.

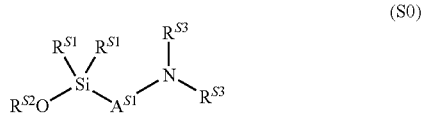

(S0)

Herein $A^{S1}$ is a straight, branched or cyclic $C_2$-$C_{20}$ alkylene group, $C_6$-$C_{15}$ arylene group or $C_7$-$C_{16}$ aralkylene group which may contain a hydroxyl, ether or amino radical. $R^{S1}$ is each independently $C_1$-$C_4$ alkyl or $OR^{S2}$, wherein $R^{S2}$ is hydrogen or $C_1$-$C_6$ alkyl. $R^{S3}$ is each independently hydrogen, or a $C_1$-$C_4$ alkyl group which may contain a hydroxyl or ether radical, or two $R^{S3}$ may bond together to form a ring with the nitrogen atom to which they are attached.

In formula (S0), $A^{S1}$ is a straight, branched or cyclic $C_2$-$C_{20}$ alkylene, $C_6$-$C_{15}$ arylene or $C_7$-$C_{16}$ aralkylene group optionally containing a hydroxyl, ether or amino radical, examples of which include ethylene, propylene, butylene, trimethylene, tetramethylene, pentamethylene, undecamethylene, pentadecamethylene, eicosamethylene, 1,2-cyclopentylene, 1,3-cyclopentylene, 1,2-cyclohexylene, 1,3-cyclohexylene, 1,4-cyclohexylene, norbornanediyl, 2,3'-iminoethylpropyl, 4-azaundecane-1,11-diyl, 4,7-diazanonane-1,9-diyl, 2-methylpropane-1,3-diyl, 7-azaoctadecane-1,18-diyl, 1,4-phenylene, 1,3-phenylene, trimethyleneoxyphenyl, 1,2-xylylene, 1,3-xylylene, 1,4-xylylene, 2-hydroxypropane-1,3-diyl, and 3-oxapentane-1,5-diyl. $R^{S1}$ is each independently $C_1$-$C_4$ alkyl or $OR^{S2}$, examples of which include methyl, ethyl, propyl, isopropyl, butyl, s-butyl, t-butyl, isobutyl and $OR^{S2}$. $R^{S2}$ is hydrogen or $C_1$-$C_6$ alkyl, for example, hydrogen, methyl, ethyl, propyl, isopropyl, butyl, s-butyl, t-butyl, isobutyl, amyl, isoamyl, hexyl, cyclopentyl or cyclohexyl. It is preferred for improving the solvent resistance of the first resist pattern that some or all $R^{S2}$ be hydrogen. $R^{S3}$ is each independently hydrogen, or a $C_1$-$C_4$ alkyl group which may contain a hydroxyl or ether radical, for example, hydrogen, methyl, ethyl, propyl, isopropyl, butyl, s-butyl, t-butyl, isobutyl, 2-hydroxyethyl, or 2-methoxyethyl. When two $R^{S3}$ bond together to form a ring, exemplary rings include pyrrolidine, piperidine, piperazine, N-methylpiperazine, and morpholine.

Illustrative non-limiting examples of the aminosilane compound having formula (S0) include 3-aminopropyltrimethoxysilane, 3-aminopropyltriethoxysilane, 3-aminopropyltripropoxysilane, 3-aminopropyltriisopropoxysilane, 3-aminopropyltrihydroxysilane, 2-aminoethylaminomethyltrimethoxysilane, 2-aminoethylaminomethyltriethoxysilane, 2-aminoethylaminomethyltripropoxysilane, 2-aminoethylaminomethyltrihydroxysilane, isopropylaminomethyltrimethoxysilane, 2-(2-aminoethylthio)ethyltrimethoxysilane, allyloxy-2-aminoethylaminomethyldimethylsilane, butylaminomethyltrimethoxysilane, 3-aminopropyldiethoxymethylsilane, 3-(2-aminoethylamino)propyldimethoxymethylsilane, 3-(2-aminoethylamino)propyltrimethoxysilane, 3-(2-aminoethylamino)propyltriethoxysilane, 3-(2-aminoethylamino)propyltriisopropoxysilane, piperidinomethyltrimethoxysilane, 3-(allylamino)propyltrimethoxysilane, 4-methylpiperazinomethyltrimethoxysilane, 2-(2-aminoethylthio)ethyldiethoxymethylsilane, morpholinomethyltrimethoxysilane, 4-acetylpiperazinomethyltrimethoxysilane, cyclohexylaminotrimethoxysilane, 2-piperidinoethyltrimethoxysilane, 2-morpholinoethylthiomethyltrimethoxysilane, dimethoxymethyl-2-piperidinoethylsilane, 3-morpholinopropyltrimethoxysilane, dimethoxymethyl-3-piperazinopropylsilane, 3-piperazinopropyltrimethoxysilane, 3-butylaminopropyltrimethoxysilane, 3-dimethylaminopropyldiethoxymethylsilane, 2-(2-aminoethylthio)ethyltriethoxysilane, 3-[2-(2-aminoethylamino)ethylamino]propyltrimethoxysilane, 3-phenylaminopropyltrimethoxysilane, 2-aminoethylaminomethylbenzyloxydimethylsilane, 3-(4-acetylpiperazinopropyl)trimethoxysilane, 3-(3-methylpiperidinopropyl)trimethoxysilane, 3-(4-methylpiperidinopropyl)trimethoxysilane, 3-(2-methylpiperidinopropyl)trimethoxysilane, 3-(2-morpholinoethylthiopropyl)trimethoxysilane, dimethoxymethyl-3-(4-methylpiperidinopropyl)silane, 3-cyclohexylaminopropyltrimethoxysilane, 3-benzylaminopropyltrimethoxysilane, 3-(2-piperidinoethylthiopropyl)trimethoxysilane, 3-hexamethyleneiminopropyltrimethoxysilane, 3-pyrrolidinopropyltrimethoxysilane, 3-(6-aminohexylamino)propyltrimethoxysilane, 3-(methylamino)propyltrimethoxysilane, 3-(ethylamino)-2-methylpropyltrimethoxysilane, 3-(butylamino)propyltrimethoxysilane, 3-(t-butylamino)propyltrimethoxysilane, 3-(diethylamino)propyltrimethoxysilane, 3-(cyclohexylamino)propyltrimethoxysilane, 3-anilinopropyltrimethoxysilane, 4-aminobutyltrimethoxysilane, 11-aminoundecyltrimethoxysilane, 11-aminoundecyltriethoxysilane, 11-(2-aminoethylamino)undecyltrimethoxysilane, p-aminophenyltrimethoxysilane, m-aminophenyltrimethoxysilane, 3-(m-aminophenoxy)propyltrimethoxysilane, 2-(2-pyridyl)ethyltrimethoxysilane, 2-[(2-aminoethylamino)methylphenyl]ethyltrimethoxysilane, diethylaminomethyltriethoxysilane, 3-[(3-acryloyloxy-2-hydroxypropyl)amino]propyltriethoxysilane, 3-(ethylamino)-2-methylpropyl(methyldiethoxysilane), and 3-[bis(hydroxyethyl)amino]propyltriethoxysilane.

The aminosilane compounds of formula (S0) may be used alone or in admixture of two or more. They may also be used in the form of (partial) hydrolyzates or (partial) hydrolytic condensates.

Suitable aminosilane compounds of formula (S0) further include reaction products of an oxirane-containing silane compound with an amine compound, as represented by the general formula (S1).

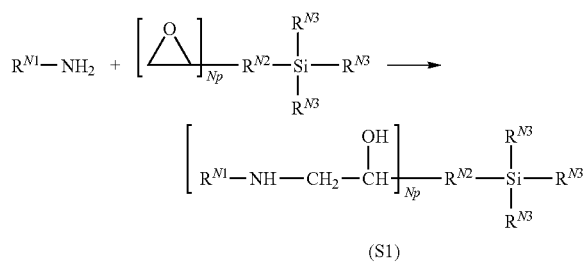

(S1)

Herein $R^{N1}$ is hydrogen, or a straight, branched or cyclic $C_1$-$C_{20}$ alkyl, $C_6$-$C_{10}$ aryl or $C_2$-$C_{12}$ alkenyl group which may have a hydroxyl, ether, ester or amino radical. The subscript Np is 1 or 2. When Np is 1, $R^{N2}$ is a straight, branched or cyclic $C_1$-$C_{20}$ alkylene group which may have an ether, ester or phenylene radical. When Np is 2, $R^{N2}$ is the alkylene group with one hydrogen atom being eliminated. $R^{N3}$ is each independently hydrogen, or a $C_1$-$C_6$ alkyl, $C_6$-$C_{10}$ aryl, $C_2$-$C_{12}$ alkenyl, $C_1$-$C_6$ alkoxy, $C_6$-$C_{10}$ aryloxy, $C_2$-$C_{12}$ alkenyloxy, $C_7$-$C_{12}$ aralkyloxy or hydroxyl group, at least one of $R^{N3}$ being alkoxy or hydroxyl.

Desired among the amine compounds are primary and secondary amine compounds. Suitable primary amine compounds include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, ethanolamine, N-hydroxyethylethylamine, and N-hydroxypropylethylamine. Suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

On use, the aminosilane compound may be blended with another silane compound. Blends of aminosilanes and oxirane-containing silanes are described in, for example, JP-A 2005-248169. When an aminosilane of formula (S0') wherein one $R^5$ is hydrogen (i.e., aminosilane having a secondary amino group) or wherein two $R^5$ are hydrogen atoms (i.e., aminosilane having a primary amino group) is mixed with an oxirane-containing silane, a silane compound having the general formula (S2) forms according to the following reaction scheme and adsorbs to the resist surface.

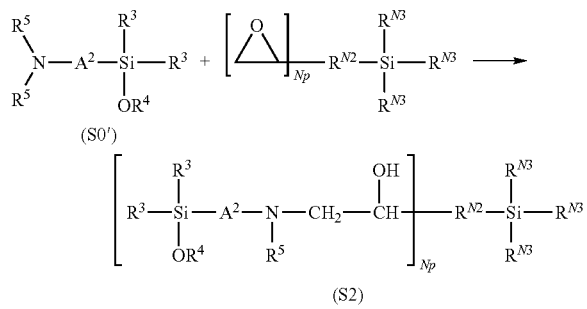

(S2)

Herein $A^2$ is a straight, branched or cyclic $C_2$-$C_{20}$ alkylene group, $C_6$-$C_{15}$ arylene group or $C_7$-$C_{16}$ aralkylene group which may contain a hydroxyl, ether or amino radical. $R^3$ is each independently $C_1$-$C_4$ alkyl or $OR^4$, wherein $R^4$ is hydrogen or $C_1$-$C_6$ alkyl. $R^5$ is each independently hydrogen, or a $C_1$-$C_4$ alkyl group which may contain a hydroxyl or ether radical, or two $R^5$ may bond together to form a ring with the nitrogen atom to which they are attached. The subscript Np is 1 or 2. When Np is 1, $R^{N2}$ is a straight, branched or cyclic $C_1$-$C_{20}$ alkylene group which may have an ether, ester or phenylene radical. When Np is 2, $R^{N2}$ is the alkylene group with one hydrogen atom being eliminated. $R^{N3}$ is each independently hydrogen, or a $C_1$-$C_6$ alkyl, $C_6$-$C_{10}$ aryl, $C_2$-$C_{12}$ alkenyl, $C_1$-$C_6$ alkoxy, $C_6$-$C_{10}$ aryloxy, $C_2$-$C_{12}$ alkenyloxy, $C_7$-$C_{12}$ aralkyloxy or hydroxyl group, at least one of $R^{N3}$ being alkoxy or hydroxyl.

An oxetane-containing silane compound may be used instead of the oxirane-containing silane compound. Examples of suitable oxirane and oxetane-containing silane compounds used herein are shown below.

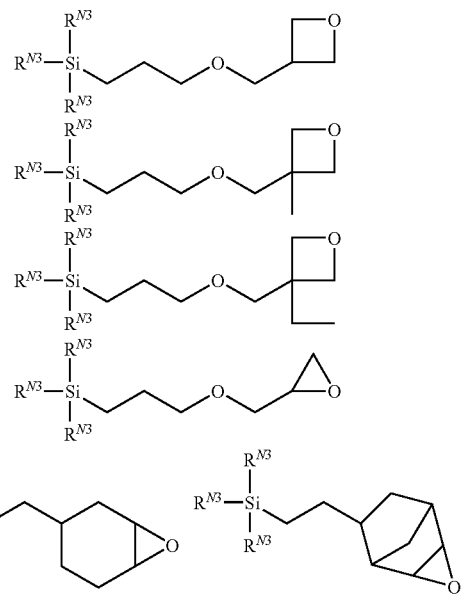

Herein $R^{N3}$ is as defined above.

Once the resist-modifying composition is coated onto the first resist pattern-bearing substrate, it is preferably baked if necessary. Thereafter, an excess of the resist-modifying composition must be removed in order to regenerate space portions. Effective removal may be performed by rinsing with a solvent that does not attack the resist pattern as used in coating of the resist-modifying composition, or water, alkaline developer or a mixture thereof. Rinsing may be followed by baking to ensure that the rinse liquid is evaporated off and the first resist pattern is modified.

For each of the baking after coating of the resist-modifying composition and the baking after rinsing, the baking temperature is preferably in a range of 50 to 170° C., more preferably up to 160° C. For minimizing deformation of the first resist pattern, the baking temperature is more preferably up to 150° C., and even more preferably up to 140° C. It is noted that one or both of these baking steps may be omitted in some cases.

Although it is not theoretically bound how the resist-modifying composition acts, the composition is believed to act according to the following mechanism, for example. In the subsurface layer of the first resist pattern, acid labile groups of part of the resist polymer are deprotected to generate acidic groups (typically carboxyl groups) during the first resist process. Once the resist-modifying composition is coated onto the first resist pattern-bearing substrate, it is baked whereby the base resin having a basic tertiary amine structure is adsorbed to and mixed with the first resist pattern subsurface layer having acidic groups through acid-base reaction. Mixing of the highly polar base resin having a secondary amide structure modifies the first resist pattern subsurface layer, specifically renders it more hydrophilic and insoluble in ordinary resist solvents such as PGMEA, thereby inhibiting dissolution of the first pattern upon coating of the second resist composition. The excess base resin in the resist-modifying composition may be washed away with water, alkaline developer or alcohol-based solvent, preventing the first resist pattern from being widened or thickened. Since the base resin having a tertiary amine structure is adsorbed to and mixed with the first resist pattern subsurface layer, the first resist pattern is endowed with basicity at the end of modifying treatment with the resist-modifying composition. During the second resist process, the acid generated by second exposure is neutralized with the basic endowment so that decomposition of acid labile groups in the first resist pattern is inhibited. That is, the first resist pattern has been fully inactivated against the second exposure and development. The first resist pattern is effectively retained in this way.

Resist Composition

Now the chemically amplified positive resist compositions used for forming resist patterns are described in detail.

The first resist composition for forming the first resist pattern is preferably a positive resist composition comprising as a base resin a polymer comprising recurring units adapted to increase alkali solubility with a progress of deprotection reaction under the action of acid (i.e., recurring units having an acid labile group) and recurring units having lactone structure. Of these units, inclusion of a polymer comprising recurring units adapted to increase alkali solubility under the action of acid is essential to formulate a chemically amplified positive resist composition. On the other hand, when the base resin in the first positive resist composition contains lactone units as predominant adhesive groups, the dissolution of the first resist composition in the resist-modifying composition is minimized and therefore, the coating of the resist-modifying composition causes least damage to the first resist pattern. As compared with the lactone-free base resin, the first resist pattern after modification treatment according to the invention has a lower solubility in ordinary resist solvents, typically PGMEA, and is thus difficultly soluble in the second positive resist composition. This leads to the advantage that the coating of the second resist composition causes least damage to the first resist pattern.

In a preferred embodiment, the first resist composition comprises a polymer comprising recurring units having the general formula (a) and recurring units having the general formula (b).

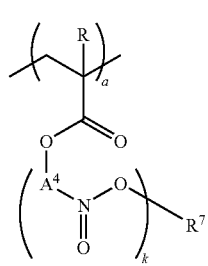

(a)

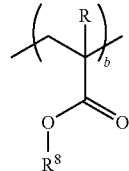

(b)

Herein R is each independently hydrogen or methyl, $A^4$ is each independently a divalent organic group, $R^7$ is an acid labile group, $R^8$ is a monovalent organic group having lactone structure, k is 0, 1 or 2, "a" and "b" indicative of molar fractions of recurring units (a) and (b) in the polymer, respectively, are numbers in the range: $0<a<1.0$, $0<b<1.0$, and $0<a+b\leq1.0$.

In formula (a), $A^4$ is each independently a divalent organic group. Examples include, but are not limited to, methylene, ethylene, trimethylene, propylene, tetramethylene, 2,6-norbornanelactone-3,5-diyl, and 7-oxa-2,6-norbornanelactone-3,5-diyl.

The acid labile group represented by $R^7$ may be selected from a variety of such groups to be deprotected with the acid generated from the photoacid generator to be described later. It may be any of well-known acid labile groups commonly used in prior art resist compositions, especially chemically amplified resist compositions. Examples of the acid labile group are groups of the following general formulae (L1) to (L4), and tertiary alkyl groups of 4 to 20 carbon atoms, preferably 4 to 15 carbon atoms.

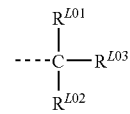

(L1)

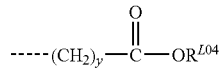

(L2)

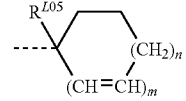

(L3)

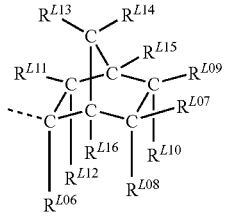

(L4)

Herein, the broken line denotes a valence bond. In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, adamantyl, and adamantylmethyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

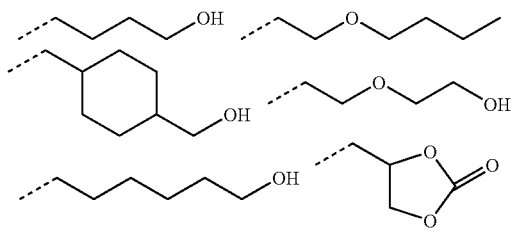

A pair of $R^{L01}$ and $R^{L02}$, $R^{L01}$, and $R^{L03}$, or $R^{L02}$ and $R^{L03}$ may bond together to form a ring with carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 2-(tricyclo[5.2.1.0$^{2,6}$]decan-8-yl)propan-2-yl, 2-(tetracyclo[4.4.0.1$^{2,5}$.1$^{7,10}$]dodecan-3-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, 8-methyl-8-tricyclo[5.2.1.0$^{2,6}$] decyl, 8-ethyl-8-tricyclo[5.2.1.0$^{2,6}$] decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_{10}$ alkyl group or an optionally substituted $C_6$-$C_{20}$ aryl group. Examples of the optionally substituted alkyl groups include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which some methylene groups are replaced by oxygen or sulfur atoms. Examples of optionally substituted aryl groups include phenyl, methylphenyl, naphthyl, anthryl, phenanthryl, and pyrenyl. Letter m is equal to 0 or 1, n is equal to 0, 1, 2 or 3, and 2m+n is equal to 2 or 3.

In formula (L4), $R^{L06}$ is an optionally substituted, straight, branched or cyclic $C_1$-$C_{10}$ alkyl group or an optionally substituted $C_6$-$C_{20}$ aryl group. Examples of these groups are the same as exemplified for $R^{L05}$. $R^{L07}$ to $R^{L16}$ independently represent hydrogen or monovalent hydrocarbon groups of 1 to 15 carbon atoms. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, $R^{L08}$, and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

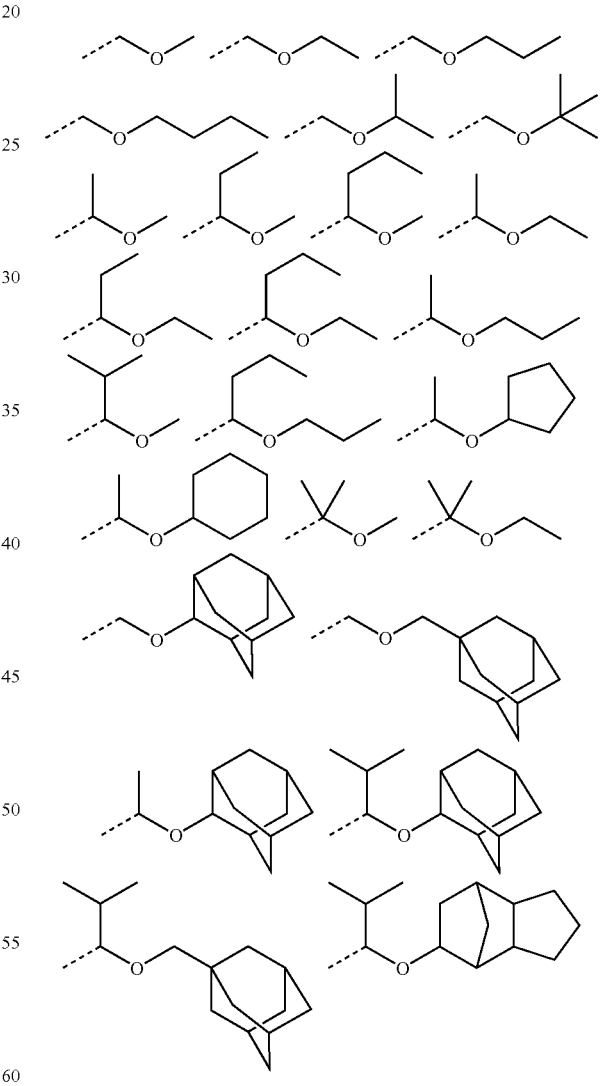

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-propylcyclopentyl, 1-isopropylcyclopentyl, 1-butylcyclopentyl, 1-sec-butylcyclopentyl, 1-cyclohexylcyclopentyl, 1-(4-methoxybutyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 1-methyl-2-cyclopentenyl, 1-ethyl-2-cyclopentenyl, 1-methyl-2-cyclohexenyl, and 1-ethyl-2-cyclohexenyl groups.

Of the acid labile groups of formula (L4), those groups of the following formulae (L4-1) to (L4-4) are preferred.

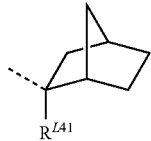
(L4-1)

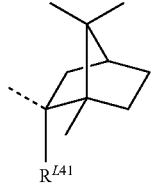
(L4-2)

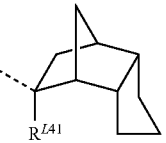
(L4-3)

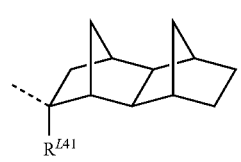
(L4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

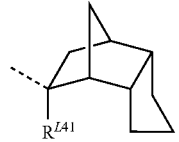
(L4-3-1)

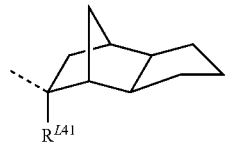
(L4-3-2)

Similarly, the general formula (L4-4) represents one or a mixture of two or more selected from groups having the following general formulas (L4-4-1) to (L4-4-4).

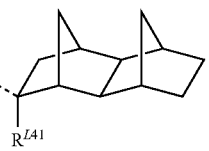
(L4-4-1)

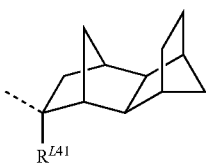
(L4-4-2)

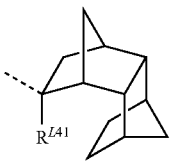
(L4-4-3)

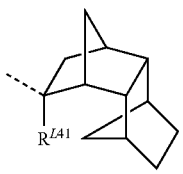
(L4-4-4)

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

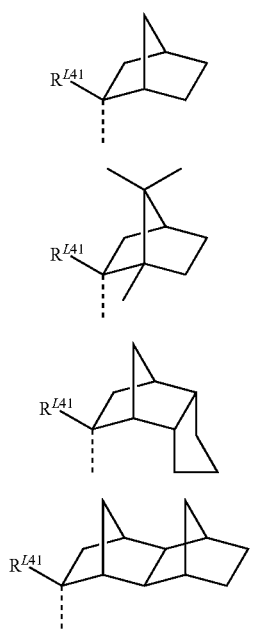
(L4-1-endo)
(L4-2-endo)
(L4-3-endo)
(L4-4-endo)
Illustrative examples of the acid labile group of formula (L4) are given below.
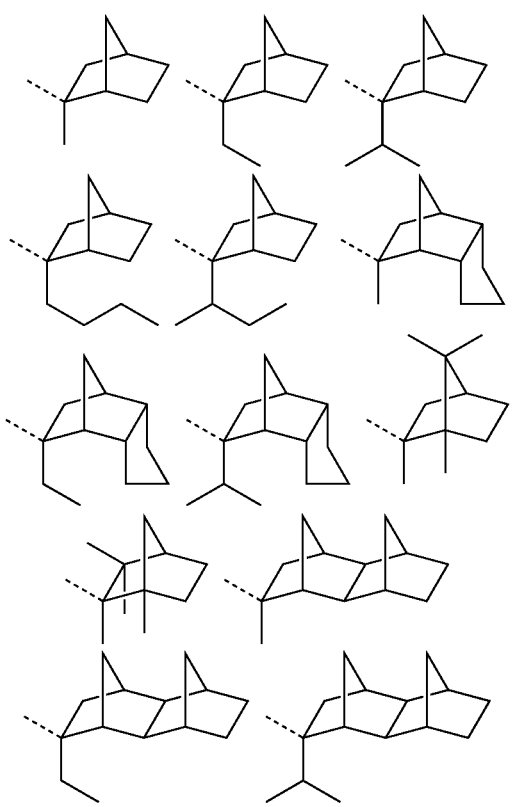
Examples of the tertiary $C_4$-$C_{20}$ alkyl groups are as exemplified for $R^{L04}$.
Examples of the recurring units (a) are given below, but not limited thereto.
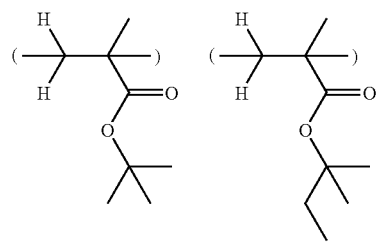
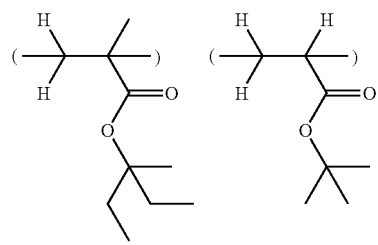
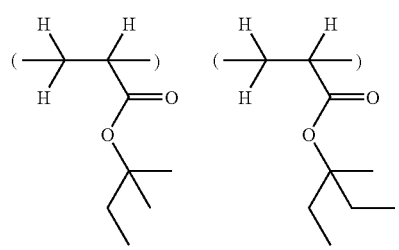
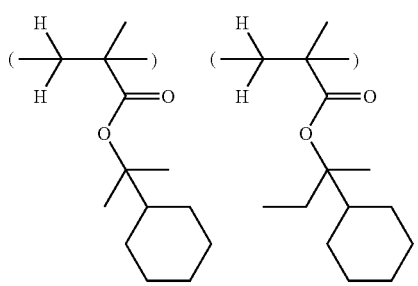
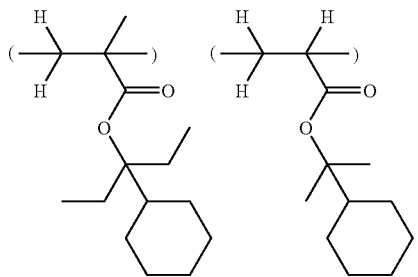
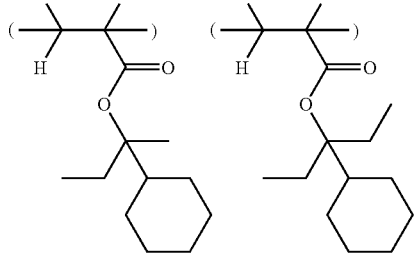

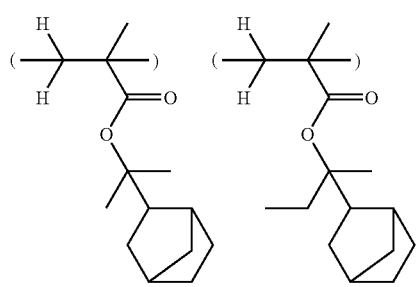
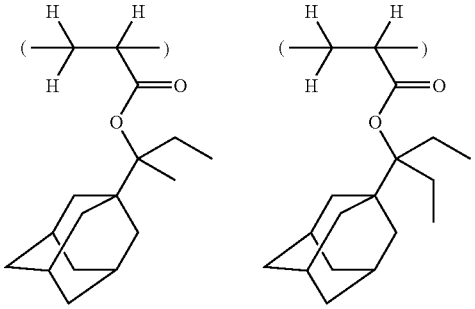

-continued
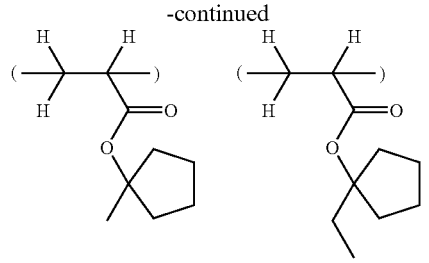
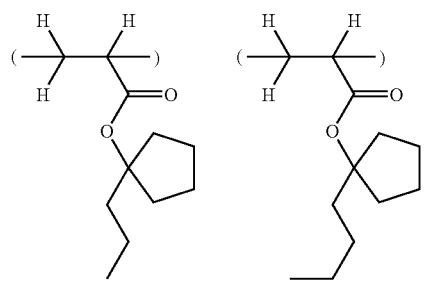
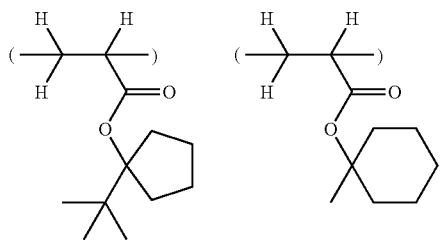
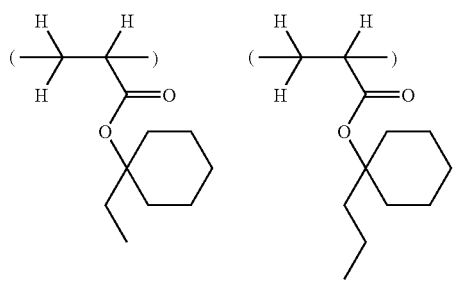
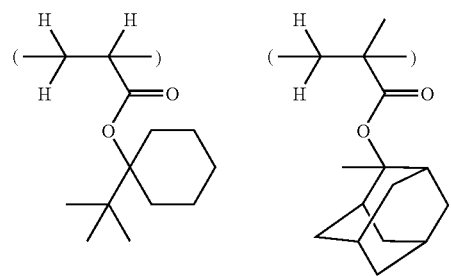
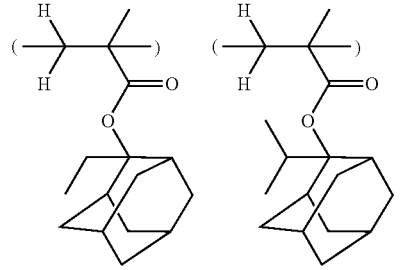
-continued
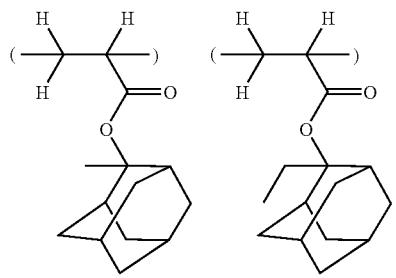
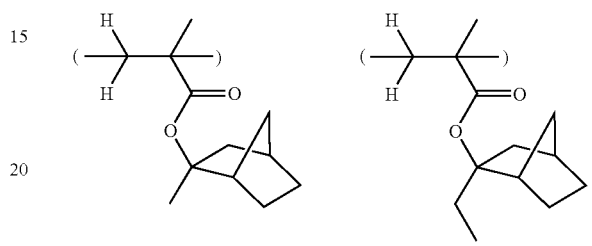
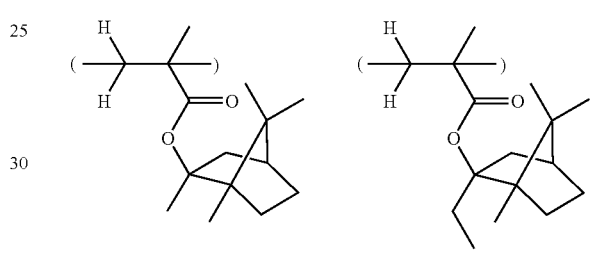
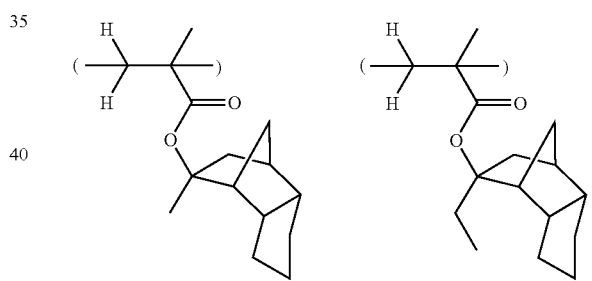
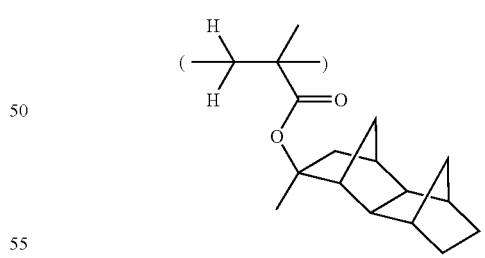
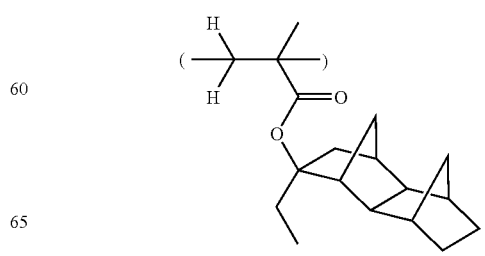

-continued
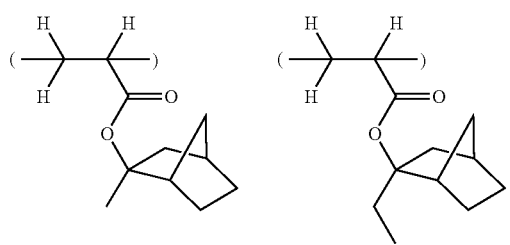
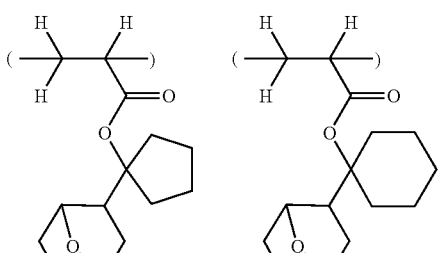
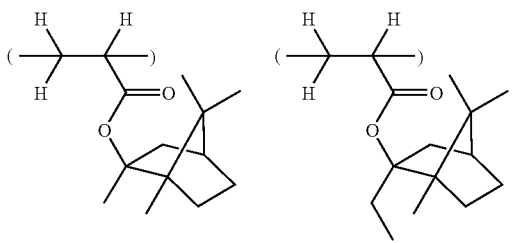
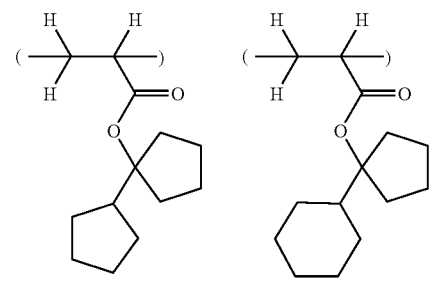
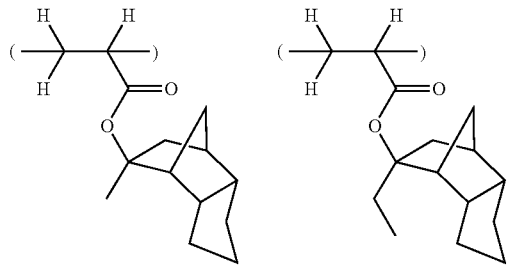
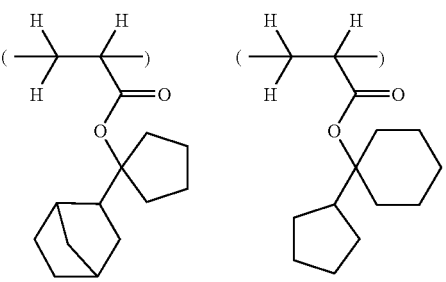
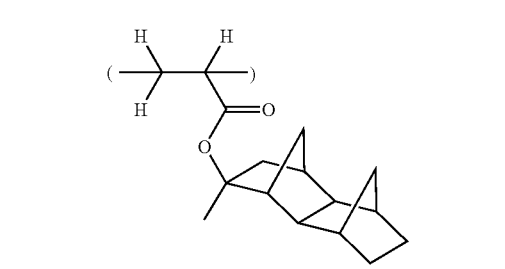
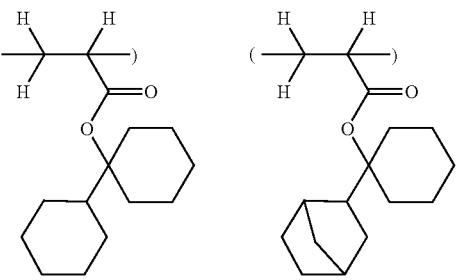
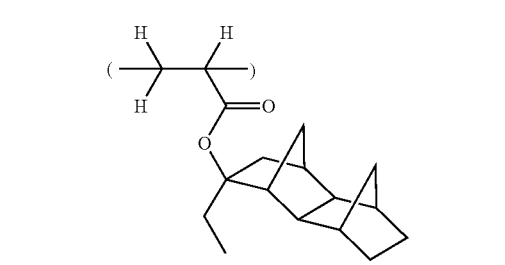
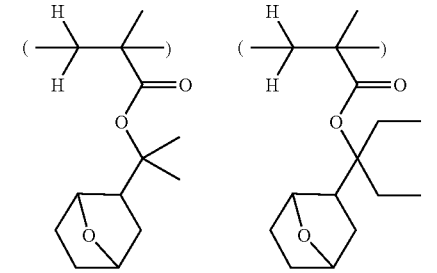
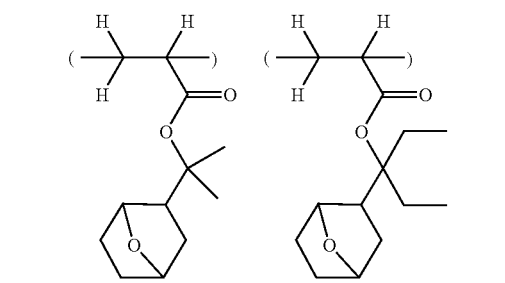
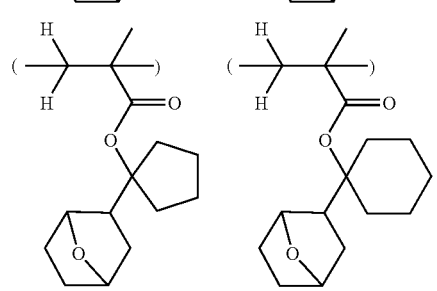

-continued
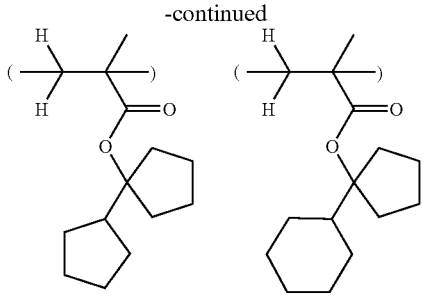
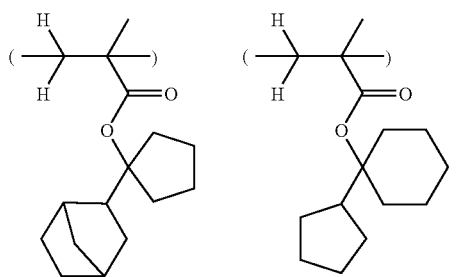
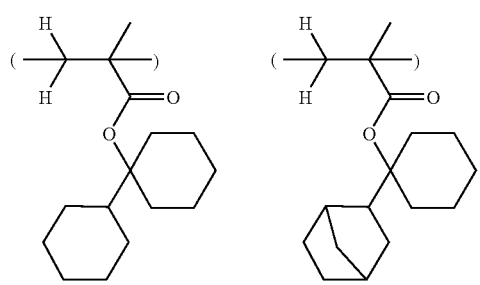
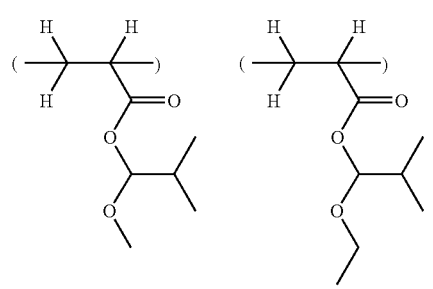
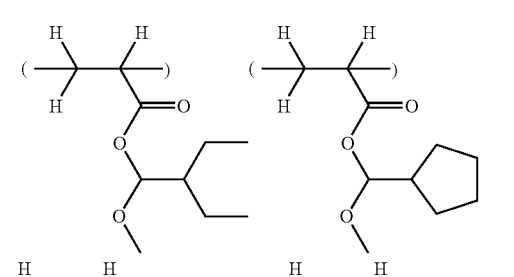
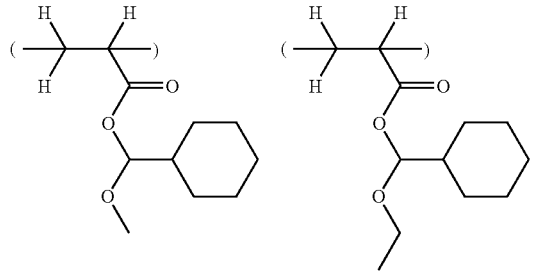
-continued
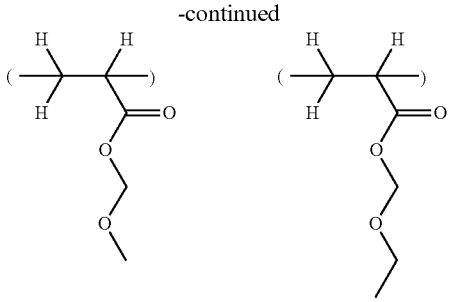
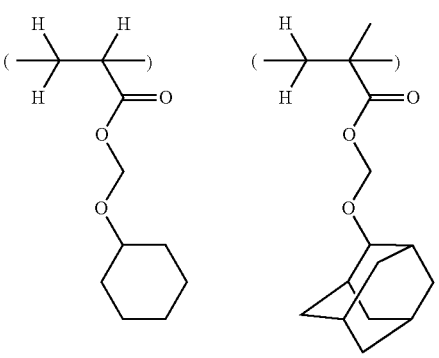
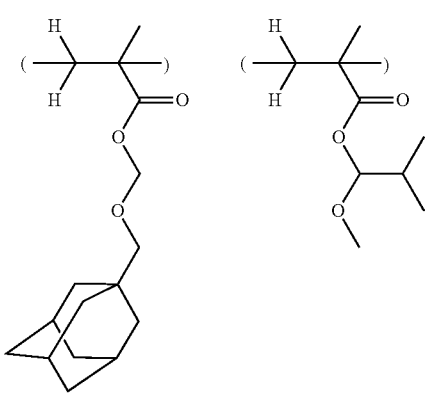
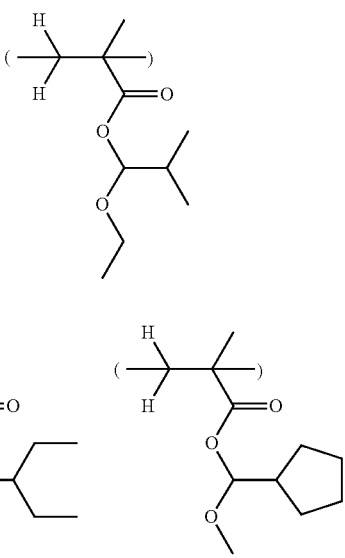

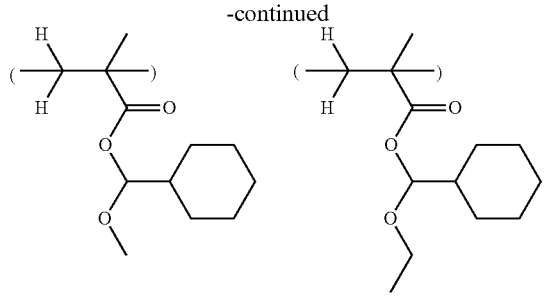
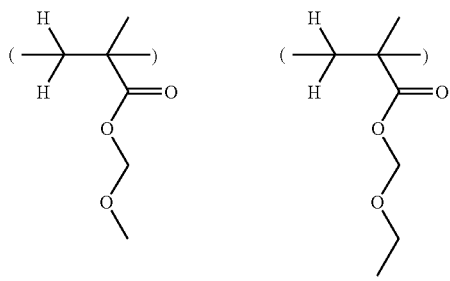
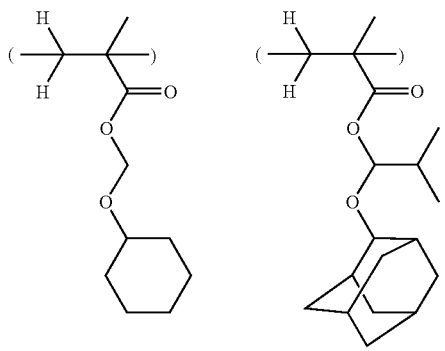
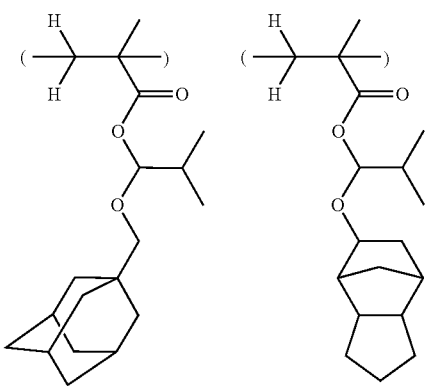
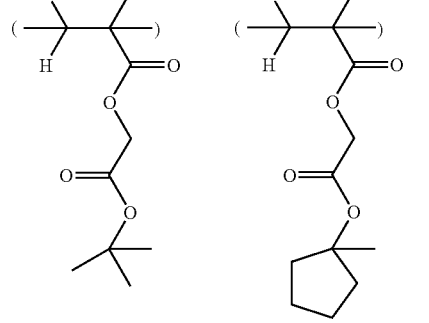
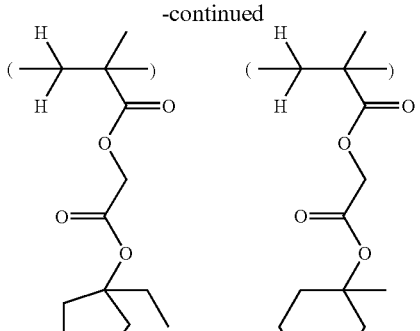
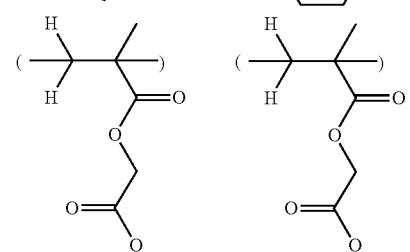
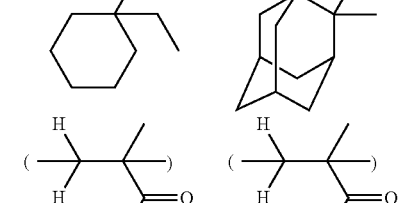
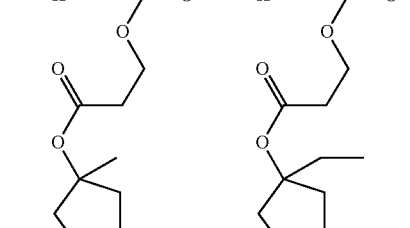
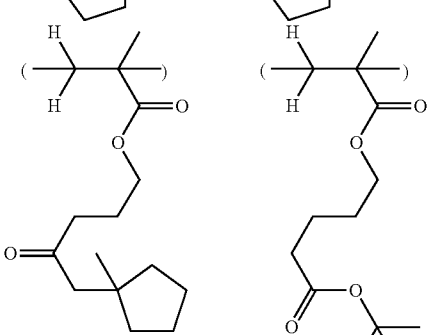
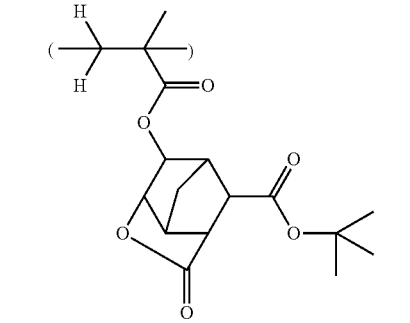

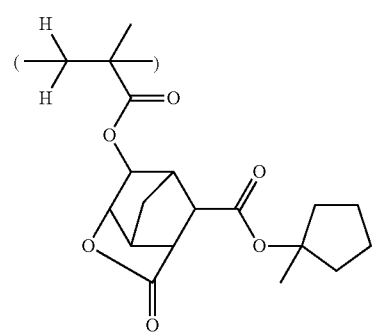
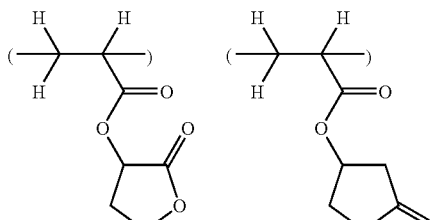
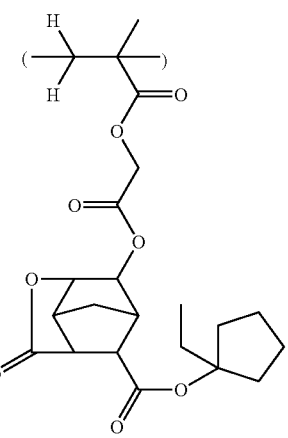
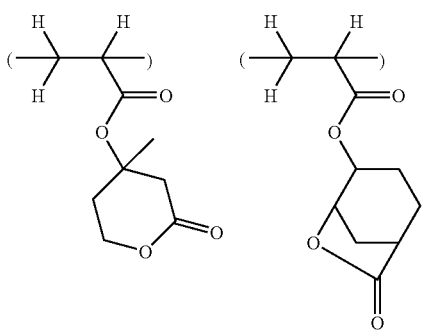
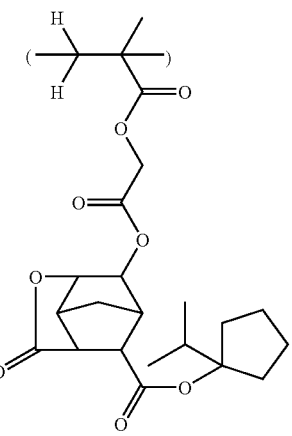
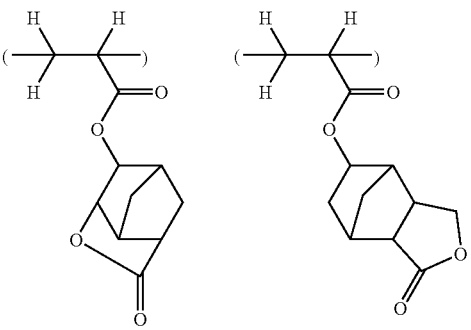
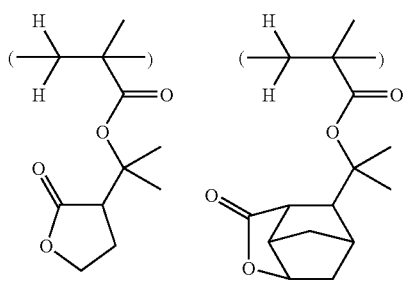
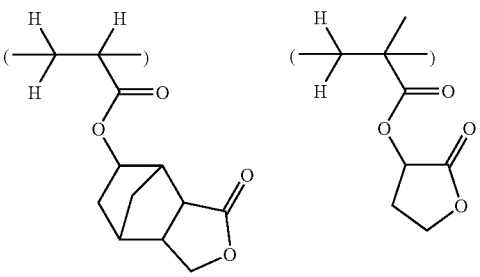
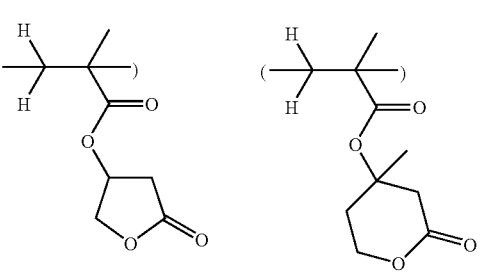
Examples of the recurring units (b) are given below, but not limited thereto.

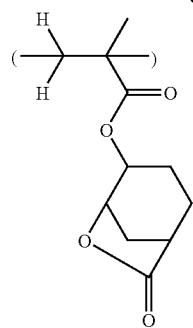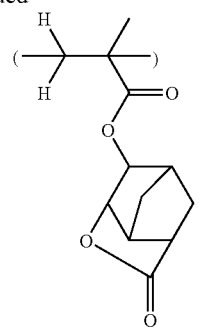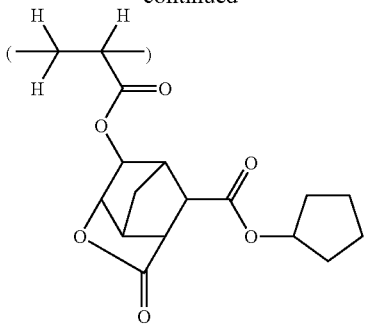
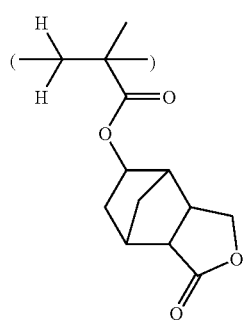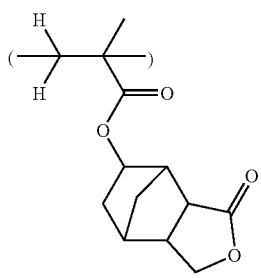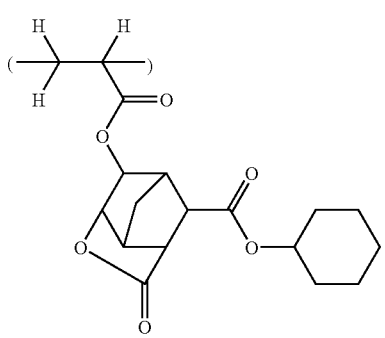
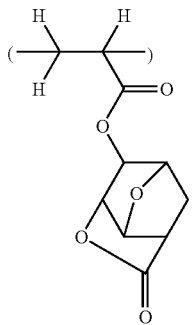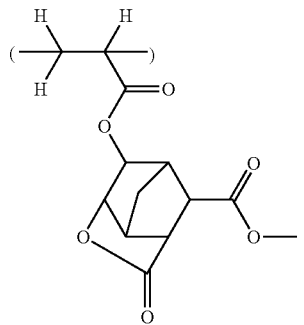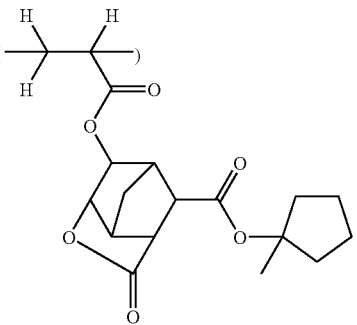
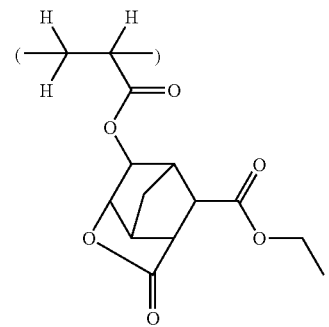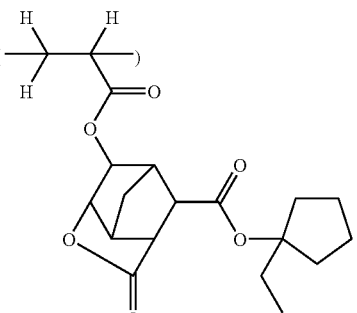
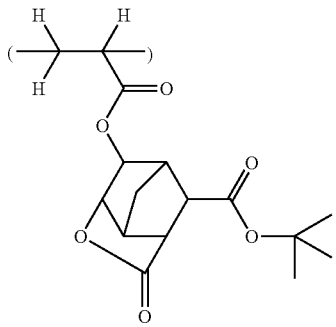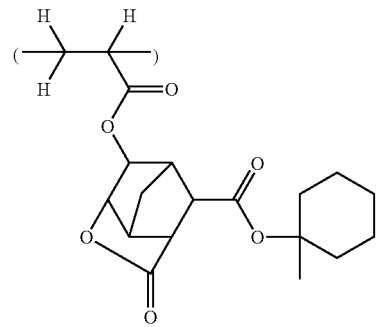

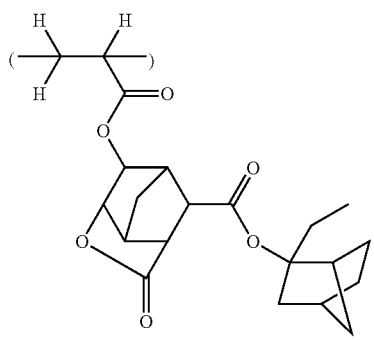
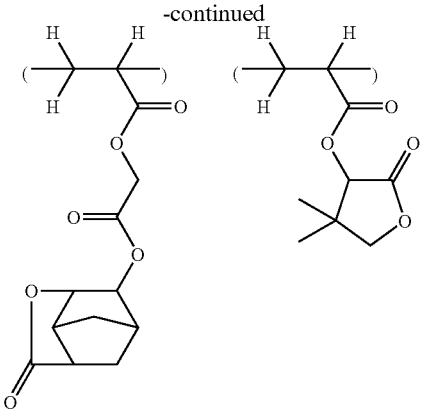
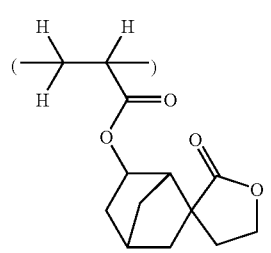
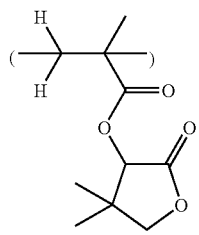
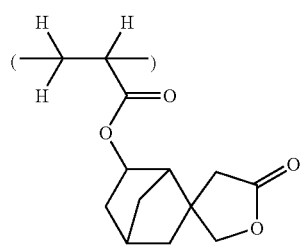
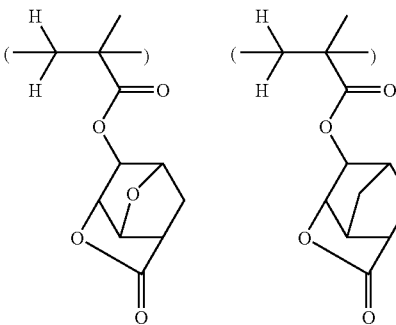
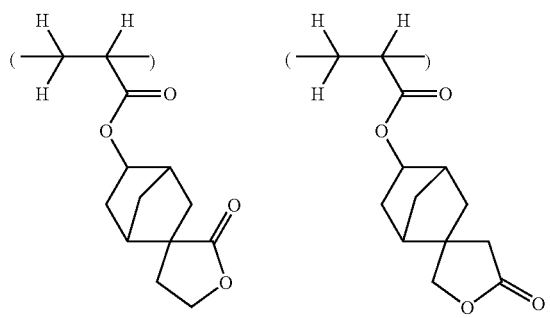
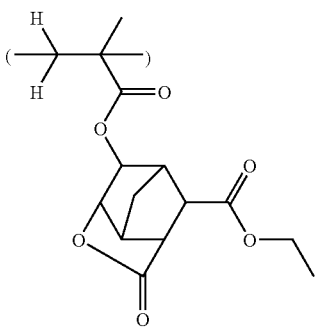
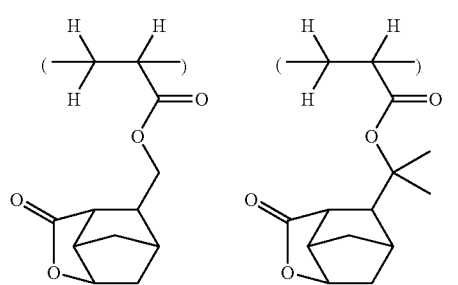
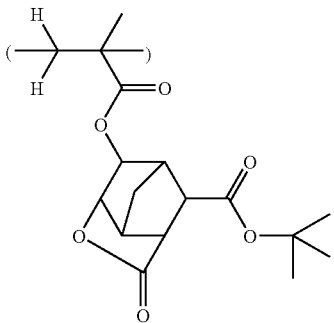

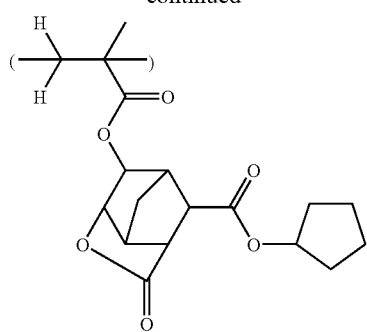
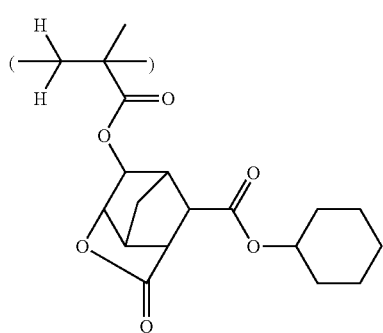
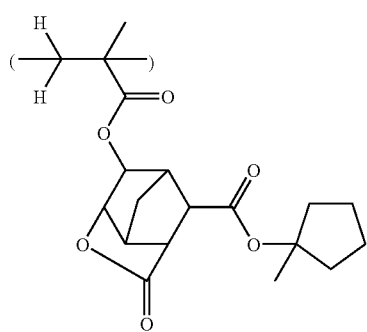
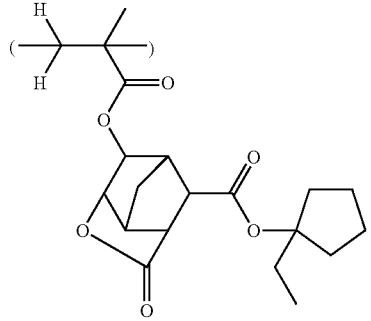
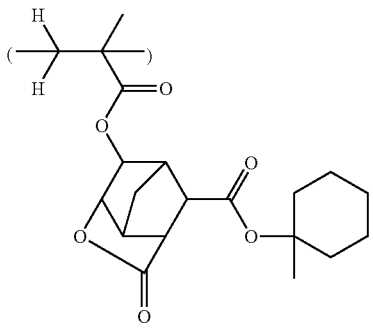
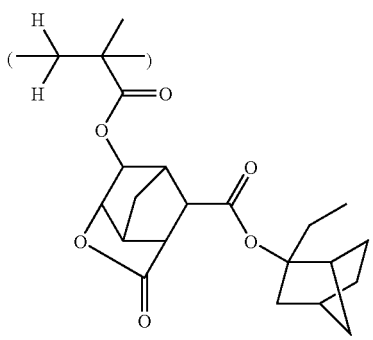
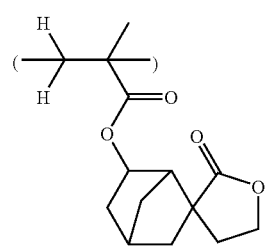
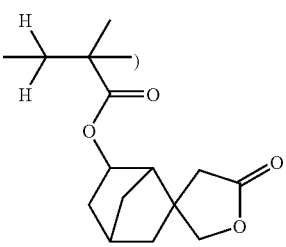
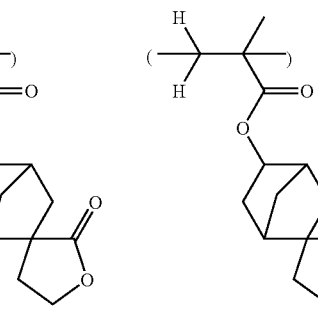
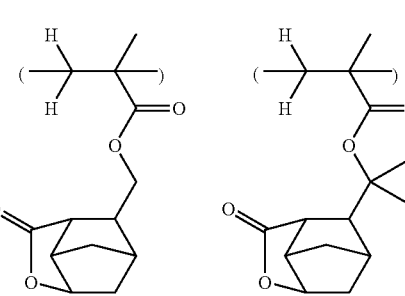
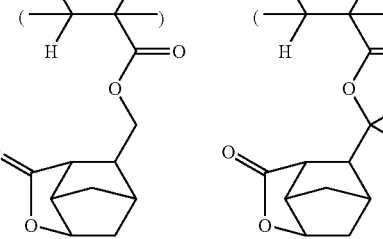
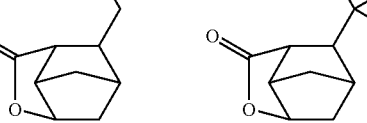

-continued

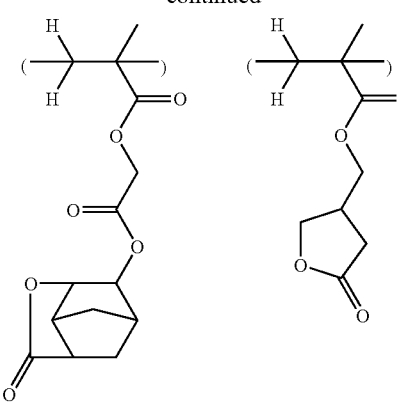

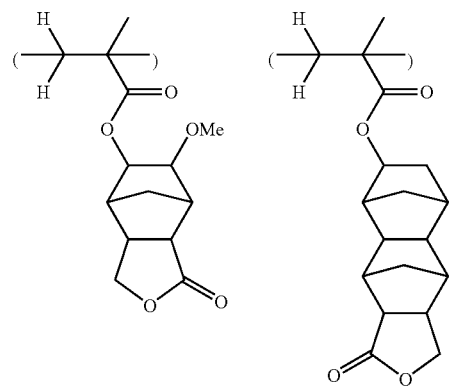

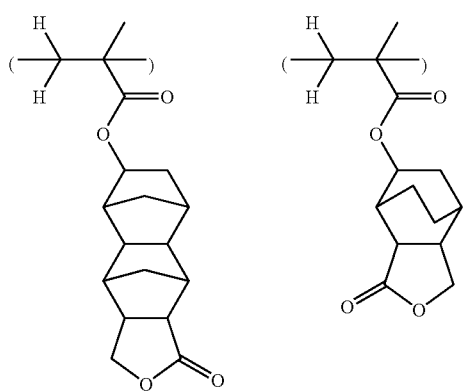

-continued

Note that Me stands for methyl.

The recurring units (a) and (b) each may be of one type or a combination of two or more types. In the polymer, the recurring units (a) and (b) are incorporated at molar fractions "a" and "b," which satisfy the range: $0<a<1.0$, $0<b<1.0$, and $0<a+b\leq1.0$, preferably $0.15<a<0.70$, $0.05<b<0.60$, and $0.2<a+b\leq1.0$.

It is meant by $a+b<1.0$ that the polymer comprises other recurring units in addition to the recurring units (a) and (b). Suitable other recurring units include, but are not limited to, recurring units derived from the monomers listed below. In the formulae, R is hydrogen or methyl.

-continued
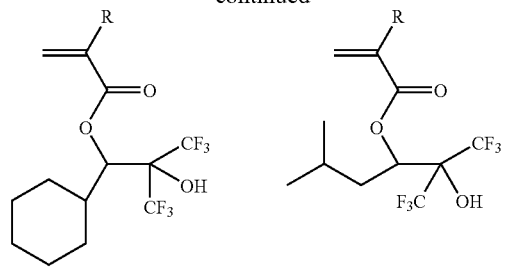
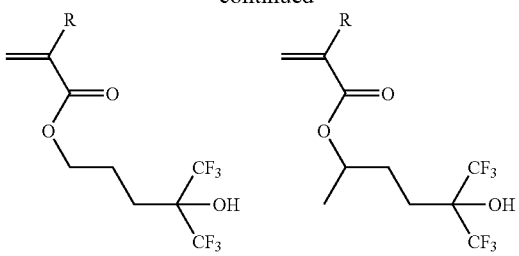
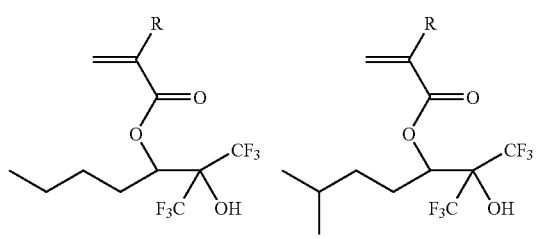
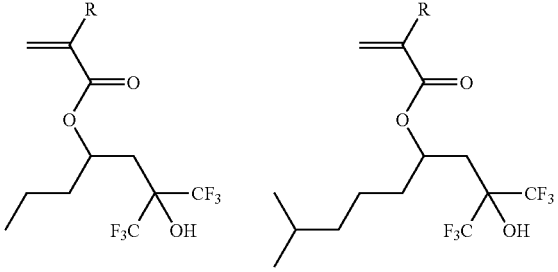
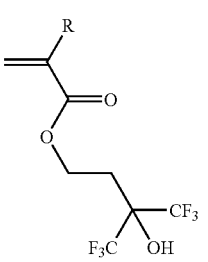
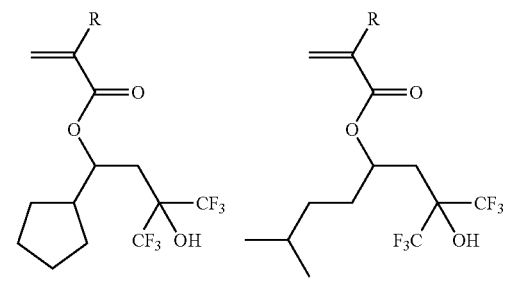
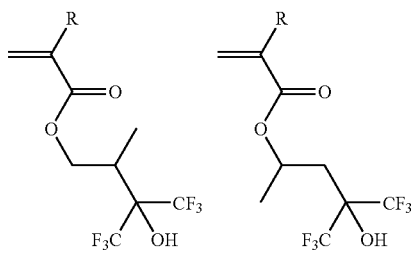
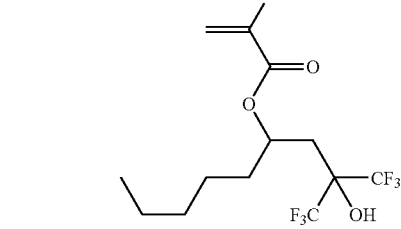
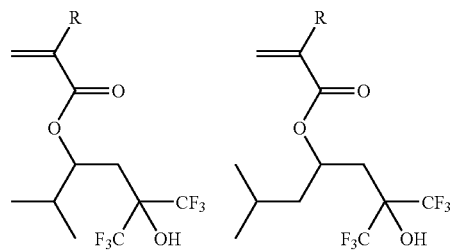
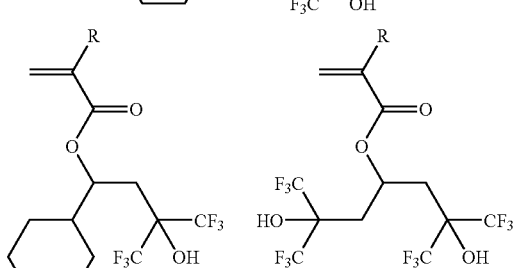
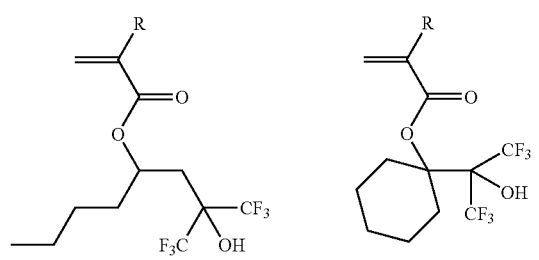
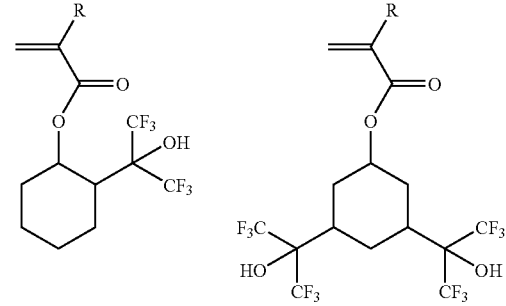

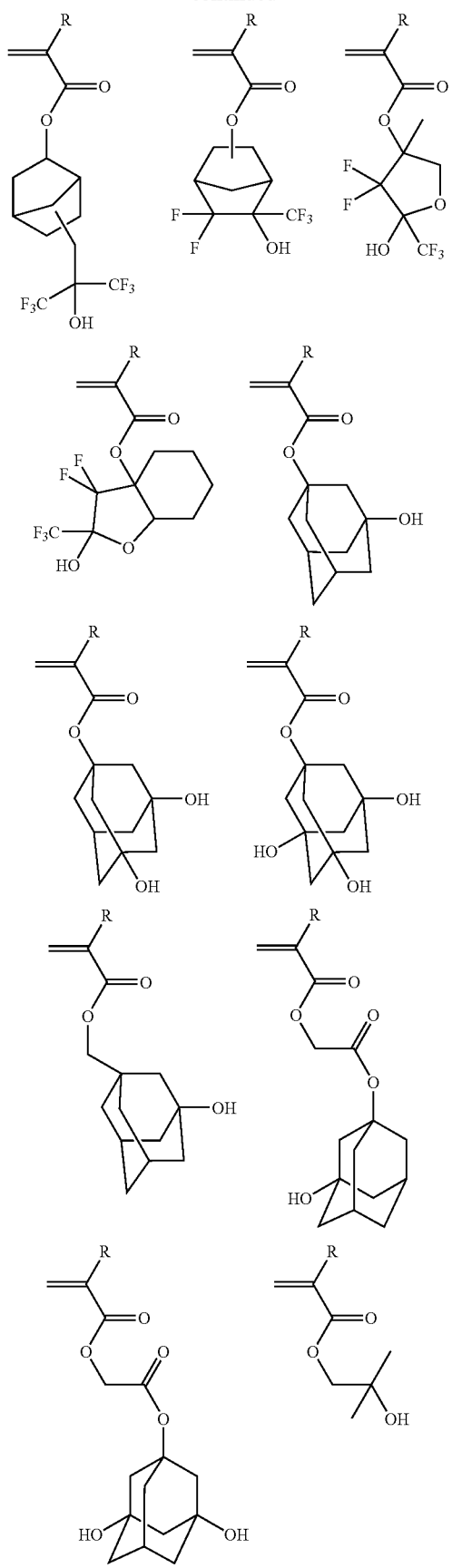
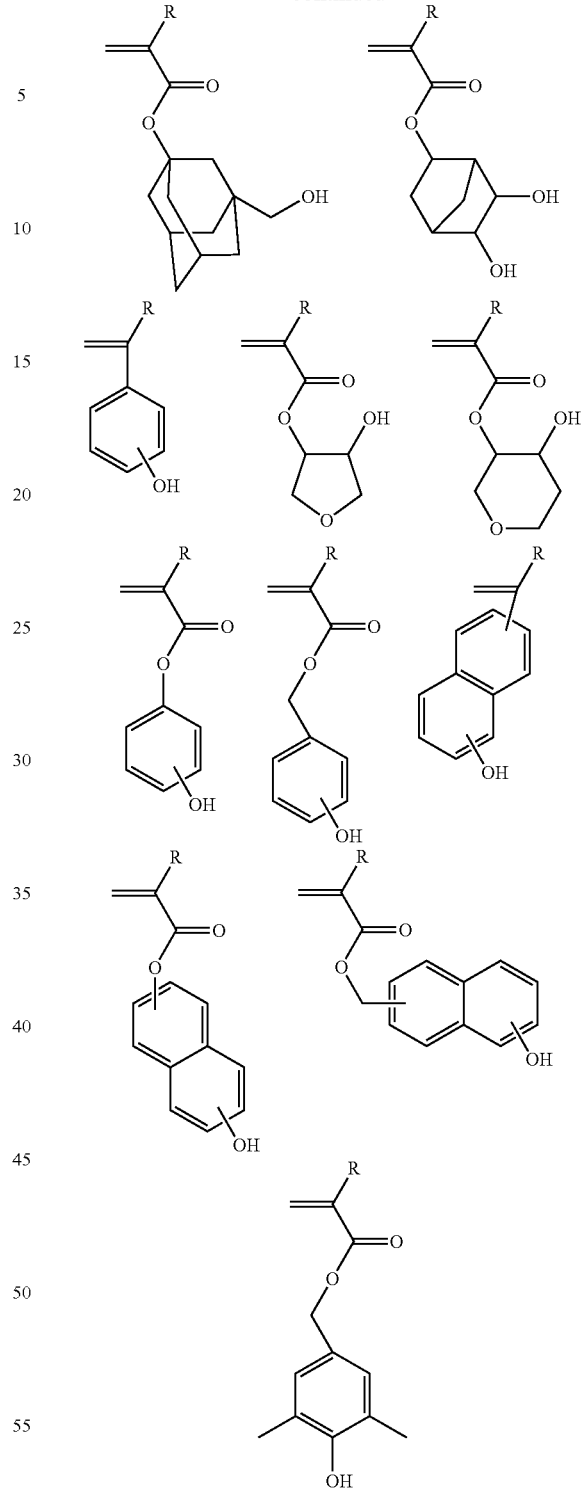

The second resist composition used in second exposure may be selected from a wide variety of well-known chemically amplified positive resist compositions as long as they have the desired lithography performance. Resist compositions meeting the following requirement are advantageously applicable. With respect to the PEB temperature, a PEB temperature of the second resist process which is lower than that of the first resist process is preferred for minimizing the damage to the first resist pattern by the second exposure and development. More preferably the difference in PEB temperature between the first and second resist processes is at least 10° C.

Specifically, the second resist composition may use the same base resin or polymer as described for the first resist composition. Acid generators and various additives may also be the same as described for the first resist composition. In accordance with the type of a particular first resist composition used, a second resist composition meeting the PEB temperature difference defined above may be selected. Although the design of the second resist composition to meet the PEB temperature difference is not particularly limited, a second resist film having a lower PEB temperature than the first resist film may be formed in accordance with the design guidelines given in comparison with the first resist composition as exemplified below. The guidelines are (1) to increase the proportion of acid labile groups in the base resin, (2) to change some or all acid labile groups in the base resin to more reactive ones, (3) to lower the glass transition temperature (Tg) of the base resin, specifically by introducing recurring units having a chain structure, by reducing or eliminating hydrogen-bondable recurring units (alcohol, carboxylic acid or the like), by introducing and increasing acrylate units, or by reducing or eliminating polycyclic recurring units, (4) to increase the amount of acid generator added, and (5) to use an acid generator having a lower molecular weight. The PEB temperature may be adjusted to optimum by a proper combination of some of these guidelines.

The polymer serving as the base resin in the resist composition used in the pattern forming process should preferably have a Mw in the range of 1,000 to 500,000, and more preferably 2,000 to 30,000, as measured by GPC using polystyrene standards. With too low a Mw, there may result a loss of resolution and insufficient retention of resist pattern due to an increased solubility of the resin in solvent. A polymer with too high a Mw may lose alkali solubility and give rise to a footing phenomenon after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 3.0, especially 1.0 to 2.0, in order to provide a resist composition suitable for micropatterning to a small feature size. It is understood that a blend of two or more polymers which differ in compositional ratio, molecular weight or dispersity is acceptable.

The polymer used herein may be synthesized by any desired method, for example, by dissolving unsaturated bond-containing monomers corresponding to the respective units in an organic solvent, adding a polymerization initiator, typically radical polymerization initiator thereto, and effecting polymerization. Examples of the organic solvent which can be used for polymerization include toluene, benzene, tetrahydrofuran, diethyl ether, dioxane, isopropyl alcohol, 2-butanone, γ-butyrolactone, 1-methoxy-2-propyl acetate, and mixtures thereof. Examples of the radical polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 40° C. to the boiling point of the solvent for polymerization to take place. The reaction time is 1 to 100 hours, preferably 3 to 20 hours.

The acid labile group that has been incorporated in the monomer may be kept as such, or the acid labile group may be once removed with an acid catalyst and thereafter protected or partially protected. The polymer serving as the base resin is not limited to one type and a mixture of two or more polymers may be added. The use of plural polymers allows for adjustment of resist properties.

The first or second positive resist composition used herein may include an acid generator in order for the composition to function as a chemically amplified positive resist composition. Typical of the acid generator used herein is a photoacid generator (PAG) capable of generating an acid in response to actinic light or radiation. It is any compound capable of generating an acid upon exposure to high-energy radiation. Suitable photoacid generators include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in U.S. Pat. No. 7,537,880 (JP-A 2008-111103, paragraphs [0122] to [0142]). The acid generator is typically used in an amount of 0.1 to 30 parts, and preferably 0.1 to 20 parts by weight per 100 parts by weight of the base resin.

The resist composition may further comprise an organic solvent, basic compound, dissolution regulator, surfactant, and acetylene alcohol, alone or in combination.

Examples of the organic solvent added to the first and second resist compositions are described in U.S. Pat. No. 7,537,880 (JP-A 2008-111103, paragraphs [0144] to [0145]. The organic solvent used herein may be any organic solvent in which the base resin, acid generator, and other components are soluble. Illustrative, non-limiting, examples of the organic solvent include ketones such as cyclohexanone and methyl-2-n-amyl ketone; alcohols such as 3-methoxybutanol, 3-methyl-3-methoxybutanol, 1-methoxy-2-propanol, 1-ethoxy-2-propanol, butanol, isobutyl alcohol, 2-methylbutanol, and 3-methylbutanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, PGMEA, and mixtures thereof because the acid generator is most soluble therein.

An appropriate amount of the organic solvent used is 200 to 5,000 parts, especially 400 to 3,000 parts by weight per 100 parts by weight of the base resin.

In the second resist composition, not only the organic solvents mentioned above, but also $C_3$-$C_8$ alcohols and $C_6$-$C_{12}$ ethers are useful. Examples of $C_3$-$C_8$ alcohol include n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol. Examples of $C_6$-$C_{12}$ ether include methyl cyclopentyl ether, methyl cyclohexyl ether, anisole, diisopropyl ether, diisobutyl ether, diisopentyl ether, di-n-pentyl ether, methyl cyclopentyl ether, methyl cyclohexyl ether, di-n-butyl ether, di-sec-butyl ether, diisopentyl ether, di-sec-pentyl ether, di-tert-amyl ether, and di-n-hexyl ether.

For use in the first and second resist compositions, exemplary basic compounds are described in JP-A 2008-111103 (U.S. Pat. No. 7,537,880), paragraphs [0146] to [0164], and exemplary surfactants in paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. These components may be blended in standard amounts.

These components may be used in standard amounts. For example, the dissolution regulator may be used in an amount of 0 to 50 parts, especially 0 to 40 parts, the basic compound may be used in an amount of 0.001 to 2 parts, especially 0.01 to 1 part, the surfactant may be used in an amount of 0 to 10 parts, especially 0.0001 to 5 parts, and the acetylene alcohol may be used in an amount of 0.01 to 2 parts, especially 0.02 to 1 part, all expressed in parts by weight relative to 100 parts by weight of the base resin.

Process

Now, the double patterning process is described. FIGS. 4 to 6 illustrate prior art double patterning processes.

Referring to FIG. 4, one exemplary double patterning process I is illustrated. A photoresist film 30 is coated and formed on a processable layer 20 on a substrate 10. To prevent the photoresist pattern from collapsing, the technology intends to reduce the thickness of photoresist film. One approach taken to compensate for a lowering of etch resistance of thinner film is to process the processable layer using a hard mask. The double patterning process illustrated in FIG. 4 uses a multi-layer coating in which a hard mask 40 is laid between the photoresist film 30 and the processable layer 20 as shown in FIG. 4A. In the double patterning process, the hard mask is not always necessary, and an underlayer film in the form of a carbon film and a silicon-containing intermediate film may be laid instead of the hard mask, or an organic antireflective coating may be laid between the hard mask and the photoresist film. The hard mask used herein may be of $SiO_2$, SiN, SiON, p-Si or TiN, for example. The resist material used in double patterning process I is a positive resist composition. In the process, the resist film 30 is exposed and developed (FIG. 4B), the hard mask 40 is then dry etched (FIG. 4C), the photoresist film is stripped, and a second photoresist film 50 is coated, formed, exposed, and developed (FIG. 4D). Then the processable layer 20 is dry etched (FIG. 4E). Since this etching is performed using the hard mask pattern and the second photoresist pattern as a mask, variations occur in the pattern size after etching of the processable layer due to a difference in etch resistance between hard mask 40 and photoresist film 50.

To solve the above problem, a double patterning process II illustrated in FIG. 5 involves laying two layers of hard mask 41 and 42. The upper layer of hard mask 42 is processed using a first resist pattern, the lower layer of hard mask 41 is processed using a second resist pattern, and the processable layer is dry etched using the two hard mask patterns. It is essential to establish a high etching selectivity between first hard mask 41 and second hard mask 42. Thus the process is rather complex.

FIG. 6 illustrates a double patterning process III using a trench pattern. This process requires only one layer of hard mask. However, since the trench pattern is lower in optical contrast than the line pattern, the process has the drawbacks of difficult resolution of the pattern after development and a narrow margin. It is possible to form a wide trench pattern and induce shrinkage by the thermal flow or RELACS method, but this process is more intricate. Using negative resist materials enables exposure at a high optical contrast, but the negative resist materials generally have the drawbacks of low contrast and low resolution capability as compared with positive resist materials. The trench process requires a very high accuracy of alignment because any misalignment between the first and second trenches leads to a variation in the width of the finally remaining lines.

The double patterning processes I to III described above have the drawback that two hard mask etchings are involved. Due to a concomitant drop of throughput, the processes are uneconomical.

FIG. 1 illustrates the double patterning process of the invention. FIG. 1A shows a structure wherein a first resist film 30 of the first positive resist composition is formed on a processable layer 20 on a substrate 10 via a hard mask 40 as in FIG. 4A. The first resist film 30 is exposed patternwise and developed to form a first resist pattern (FIG. 1B). The resist film 30 is then treated with the resist-modifying composition for modification into a first resist pattern 30a which is inactivated to the second resist process (FIG. 1C). The excess resist-modifying composition is desirably stripped off using water or alkaline developer. The structure may then be baked in order to promote modification of the first resist pattern. The preferred baking is at 50 to 170° C. for 5 to 600 seconds. A temperature higher than 170° C. is undesired because the resist pattern may be deformed due to thermal flow or shrunk as a result of deprotection of acid labile groups. The baking temperature is preferably up to 150° C., more preferably up to 140° C., and even more preferably up to 130° C. The pattern is little deformed if baking is at or below 130° C.

Next, the second resist composition is coated on the first pattern-bearing substrate to form a second resist film. Through patternwise exposure and development of the second resist film, a second resist pattern 50 is formed in an area where features of the inactivated first resist pattern 30a have not been formed (FIG. 1D). Thereafter, the hard mask 40 is etched (FIG. 1E). The processable layer 20 is dry etched, and finally, the inactivated first resist pattern 30a and second resist pattern 50 are removed (FIG. 1F). Single etching of the hard mask leads to a high throughput, making the process economical.

Figure 2B:
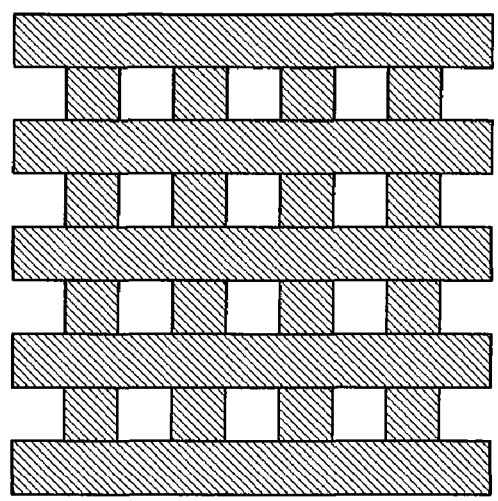
FIG. 2B shows a second resist pattern being formed.
Figure 3A:
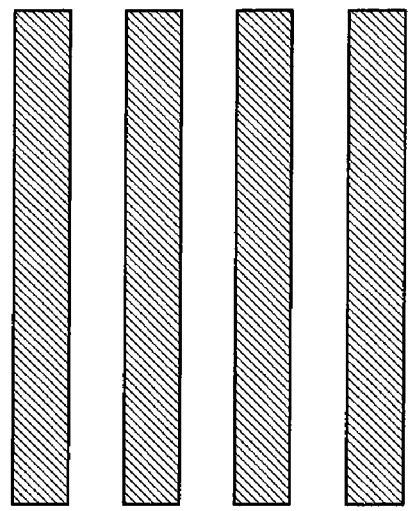
FIG. 3A shows a first resist pattern being formed.
Figure 3B:
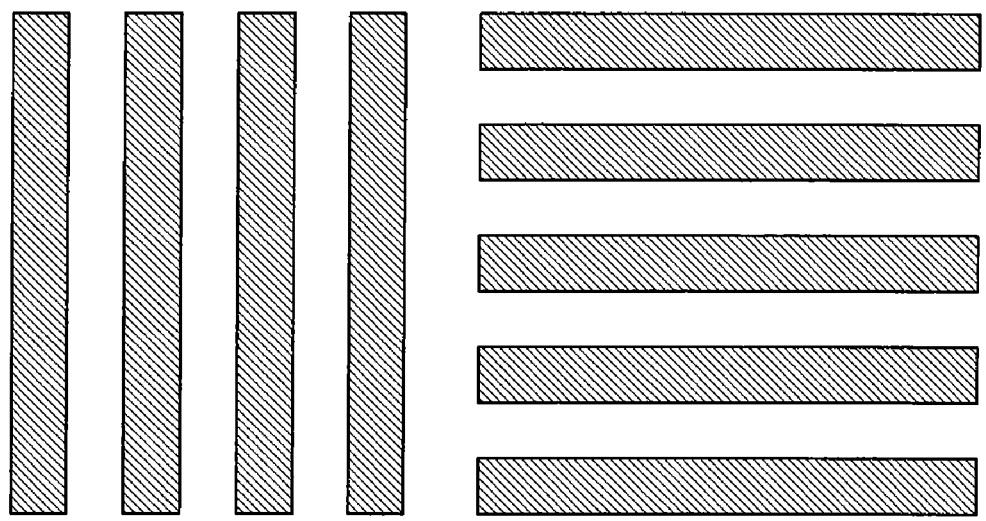
FIG. 3B shows a second resist pattern being formed.
Figure 4A:
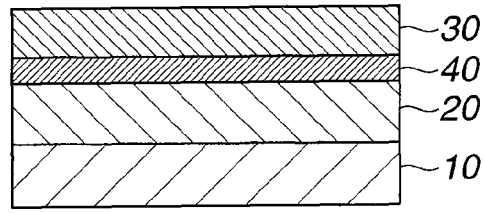
FIG. 4A shows a laminate of substrate, processable layer, hard mask and resist film.
Figure 4B:
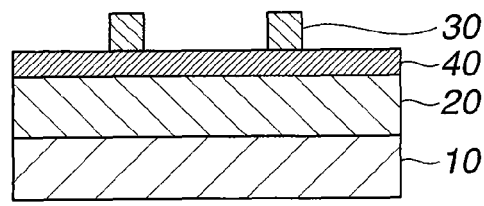
FIG. 4B shows the resist film being exposed and developed.
Figure 4C:
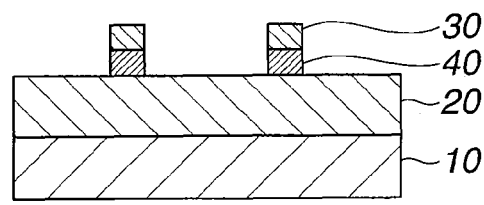
FIG. 4C shows the hard mask being etched.
Figure 4D:
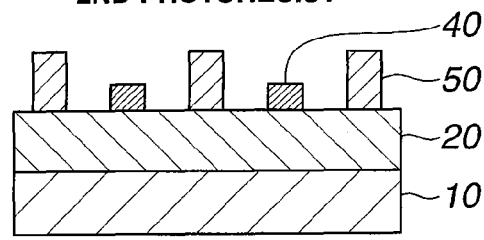
FIG. 4D shows a second resist film being formed, exposed and developed.
Figure 4E:
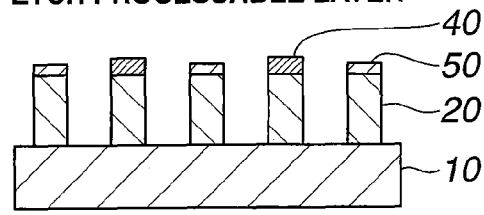
FIG. 4E shows the processable layer being etched.
Figure 5A:
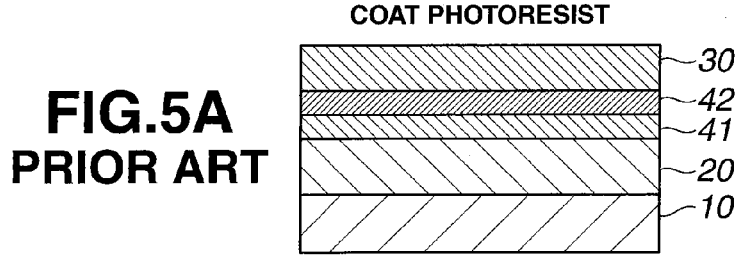
FIG. 5A shows a laminate of substrate, processable layer, 1st and 2nd hard masks and resist film.
Figure 5B:
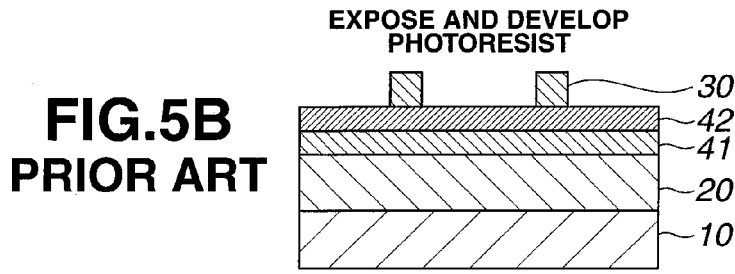
FIG. 5B shows the resist film being exposed and developed.
Figure 5C:
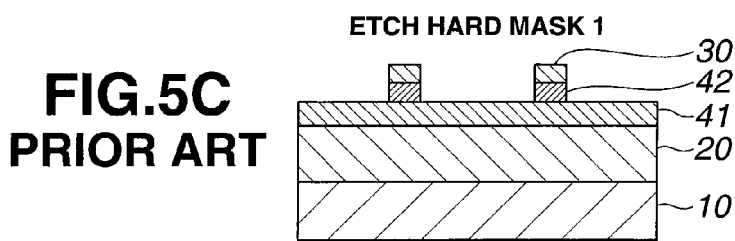
FIG. 5C shows the 2nd hard mask being etched.
Figure 5D:
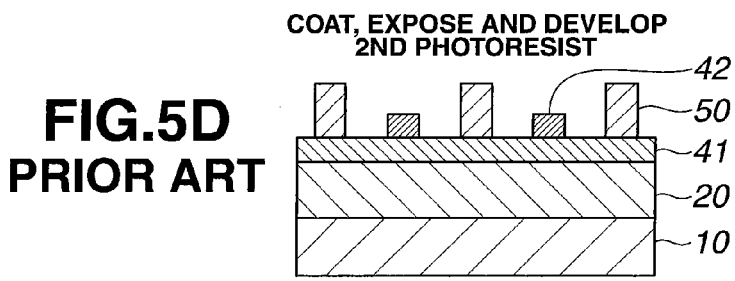
FIG. 5D shows, after removal of the first resist film, a second resist film being formed, exposed and developed.
Figure 5E:
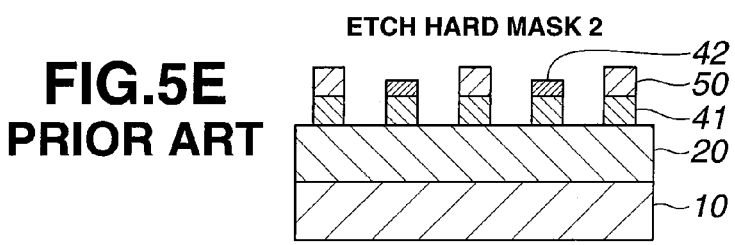
FIG. 5E shows the 1st hard mask being etched.
Figure 5F:
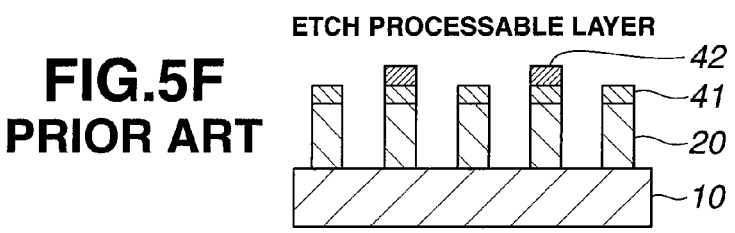
FIG. 5F shows the processable layer being etched.
Figure 6A:
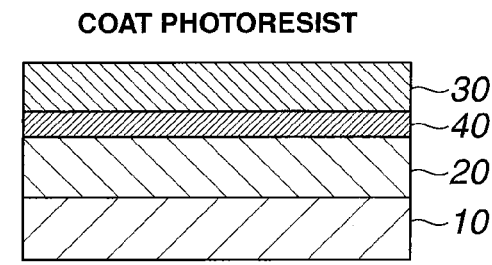
FIG. 6A shows a laminate of substrate, processable layer, hard mask and resist film.
Figure 6B:
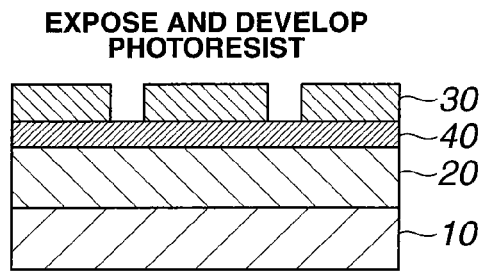
FIG. 6B shows the resist film being exposed and developed.
Figure 6C:
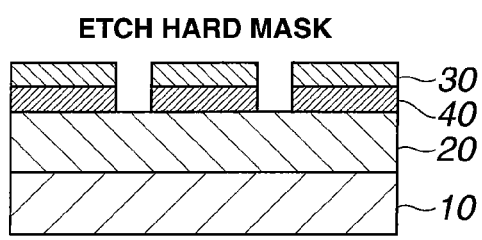
FIG. 6C shows the hard mask being etched.
Figure 6D:
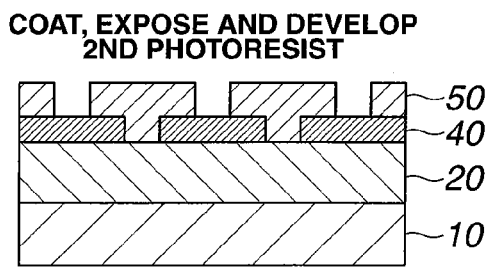
FIG. 6D shows, after removal of the first resist film, a second resist film being formed, exposed and developed.
Figure 6E:
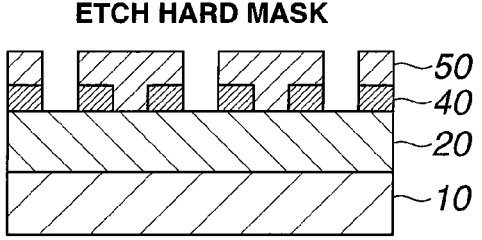
FIG. 6E shows the hard mask being etched.
Figure 6F:
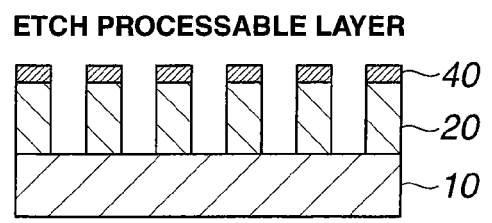
FIG. 6F shows the processable layer being etched.

The process illustrated in FIG. 1 forms the second pattern in spaces of the first pattern for reducing the distance between features of the final resist pattern. It is also acceptable to form the second pattern so as to cross the first pattern orthogonally as shown in FIG. 2. Although such a pattern may be formed through a single exposure step, an orthogonal line pattern may be formed at a very high contrast by a combination of dipolar illumination with polarized illumination. Specifically, pattern lines in Y-direction are formed as shown in FIG. 2A and then inactivated by the process of the invention. Thereafter, a second resist is coated and processed to form pattern lines in X-direction as shown in FIG. 2B. Combining X and Y lines defines a lattice pattern while empty areas become holes. The pattern that can be formed by such a process is not limited to the orthogonal pattern, and may include a T-shaped pattern (not shown) or a separated pattern as shown in FIG. 3B.

The substrate 10 used herein is generally a silicon substrate. The processable layer 20 used herein includes $SiO_2$, SiN, SiON, SiOC, p-Si, α-Si, TiN, WSi, BPSG, SOG, Cr, CrO, CrON, MoSi, low dielectric film, and etch stopper film. The hard mask 40 is as described above. Understandably, an underlayer film in the form of a carbon film and an intermediate intervening layer in the form of a silicon-containing intermediate film or organic antireflective coating may be formed instead of the hard mask.

In the process of the invention, a first resist film of a first positive resist composition is formed on the processable layer directly or via an intermediate intervening layer such as the hard mask. The first resist film preferably has a thickness of 10 to 1,000 nm, and more preferably 20 to 500 nm. The first resist film is heated or pre-baked prior to exposure, with the preferred pre-baking conditions including a temperature of 60 to 180° C., especially 70 to 150° C. and a time of 10 to 300 seconds, especially 15 to 200 seconds.

This is followed by patternwise exposure. For the exposure, preference is given to high-energy radiation having a wavelength of 140 to 250 nm, and especially ArF excimer laser radiation of 193 nm. The exposure may be done either in air or in a dry atmosphere with a nitrogen stream, or by immersion lithography. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water or liquid introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective coating may be applied onto the resist film after pre-baking for preventing any leach-outs from the resist film and improving water slip on the film surface. The resist protective coating used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

To the first resist composition, an additive for rendering the resist surface water repellent may be added. A typical additive is a polymer having fluorinated groups such as fluoroalcohol groups. After spin coating, the polymer segregates toward the resist surface to reduce the surface energy, thereby improving water slip. Such additives are described in JP-A 2007-297590 and JP-A 2008-122932.

Exposure is preferably carried out so as to provide an exposure dose of about 1 to 200 mJ/cm$^2$, more preferably about 10 to 100 mJ/cm$^2$. This is followed by PEB on a hot plate at 60 to 150° C. for 1 to 5 minutes, preferably at 80 to 120° C. for 1 to 3 minutes.

Thereafter the resist film is developed with a developer in the form of an aqueous alkaline solution, for example, an aqueous solution of 0.1 to 5 wt %, preferably 2 to 3 wt % TMAH for 0.1 to 3 minutes, preferably 0.5 to 2 minutes by conventional techniques such as dip, puddle and spray techniques. In this way, a desired resist pattern is formed on the substrate.

Like the first resist composition, the second resist composition is coated, exposed and developed in a standard way. In one preferred embodiment, the second resist pattern is formed in an area where features of the first resist pattern have not been formed, thereby reducing the distance between pattern features. The conditions of exposure and development and the thickness of the second resist film may be the same as described above.

Next, using the inactivated first resist film and the second resist film as a mask, the intermediate intervening layer of hard mask or the like is etched, and the processable layer further etched. For etching of the intermediate intervening layer of hard mask or the like, dry etching with fluorocarbon or halogen gases may be used. For etching of the processable layer, the etching gas and conditions may be properly chosen so as to establish an etching selectivity relative to the hard mask, and specifically, dry etching with fluorocarbon, halogen, oxygen, hydrogen or similar gases may be used. Thereafter, the first and second resist films are removed. Removal of these films may be carried out after etching of the intermediate intervening layer of hard mask or the like. It is noted that removal of the resist films may be achieved by dry etching with oxygen or radicals, or using strippers such as amines, sulfuric acid/aqueous hydrogen peroxide or organic solvents.

EXAMPLE

Examples of the invention are given below by way of illustration and not by way of limitation. For all polymers, Mw and Mn are determined by GPC. The amount "pbw" is parts by weight.

Preparation Examples

Base Resin for Resist

Polymers to be used as the base resin in resist compositions were prepared by combining various monomers in 2-butanone medium, effecting copolymerization reaction in the presence of dimethyl 2,2-azobis(2-methylpropionate) as a radical polymerization initiator, crystallization in hexane, repeated washing, and vacuum drying. The resulting polymers (Polymers 1, 2) had the composition shown below. The composition of each polymer was analyzed by $^1$H-NMR and $^{13}$C-NMR, and the Mw and Mw/Mn determined by GPC versus polystyrene standards.

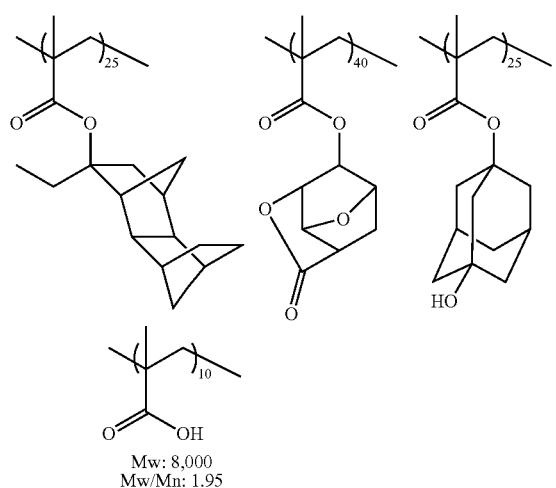

Polymer 1

Mw: 8,000
Mw/Mn: 1.95

TABLE 1-continued

| | Base resin (pbw) | Acid generator (pbw) | Basic compound (pbw) | Repellent (pbw) | Organic solvent (pbw) |
|---|---|---|---|---|---|

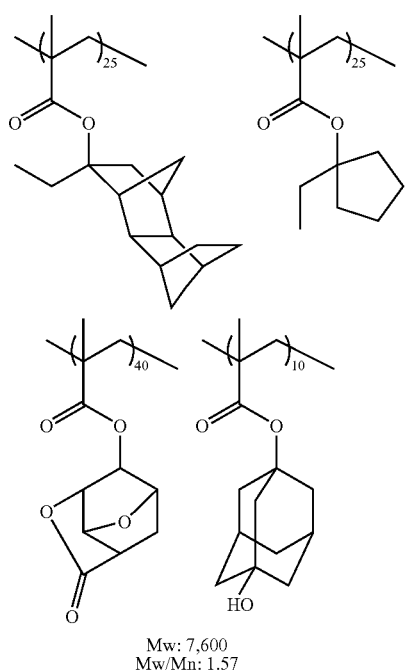

Polymer 2
Mw: 7,600
Mw/Mn: 1.57

Quencher 1

Repellent: Repellent Polymer 1 of the following formula

Repellent Polymer 1
Mw: 8,900
Mw/Mn: 1.96

Organic solvent: PGMEA

First and Second Resist Compositions

A resist solution was prepared by dissolving each polymer (Polymers 1, 2) as a base resin, an acid generator, a basic compound, and a repellent (for rendering the resist film surface water repellent) in a solvent in accordance with the recipe shown in Table 1, and filtering through a Teflon® filter with a pore size of 0.2 μm. The solvent contained 50 ppm of surfactant FC-4430 (3M-Sumitomo Co., Ltd.).

The components in Table 1 are identified below.

TABLE 1

| | Base resin (pbw) | Acid generator (pbw) | Basic compound (pbw) | Repellent (pbw) | Organic solvent (pbw) |
|---|---|---|---|---|---|
| Resist 1 | Polymer 1 (80) | PAG 1 (12.7) | Quencher 1 (2.0) | Repellent Polymer 1 (3.0) | PGMEA (1,680) Cyclohexanone (720) |
| Resist 2 | Polymer 2 (80) | PAG 1 (7.6) | Quencher 1 (1.2) | Repellent Polymer 1 (3.0) | PGMEA (1,680) Cyclohexanone (720) |

Acid generator: PAG1 of the following structural formula
Basic compound: Quencher 1 of the following structural formula

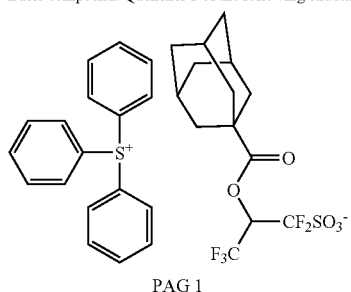

PAG 1

Examples 1-1 to 1-6, Reference Examples 1-1 to 1-3

Preparation of Resist-modifying Composition

Resist-modifying compositions A to I were prepared by mixing a polymer (Polymers 3 to 8, shown below) as a base resin, an alcohol-based solvent, and a crosslinker (C1, C2 or C3) in accordance with the recipe shown in Table 2, and filtering through a Teflon® filter with a pore size of 0.2 μm.

Polymers 3 to 7 were prepared by combining various monomers in ethanol medium, effecting copolymerization reaction in the presence of dimethyl 2,2-azobis(2-methylpropionate) as a radical polymerization initiator, and distilling off the medium. The resulting polymers (Polymers 4 to 7) had the composition shown below. The composition of each polymer was analyzed by $^1$H-NMR and $^{13}$C-NMR, and the Mw and Mw/Mn determined by GPC versus poly(methyl methacrylate) standards. Polymer 8 is polyvinyl pyrrolidone with Mw=~10,000 commercially available from Aldrich.

Polymer 3
Mw: 19,000
Mw/Mn: 2.58

Polymer 4

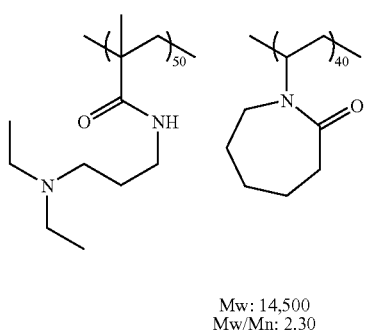

Mw: 14,500
Mw/Mn: 2.30

Polymer 5

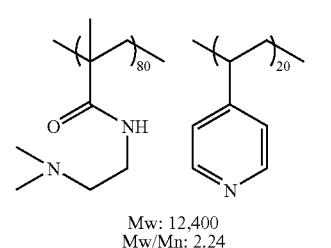

Mw: 12,400
Mw/Mn: 2.24

Polymer 6

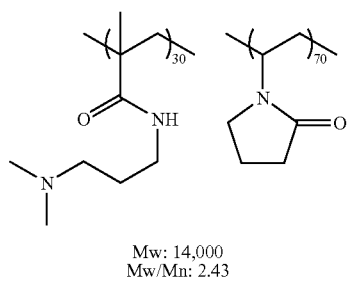

Mw: 14,000
Mw/Mn: 2.43

Polymer 7

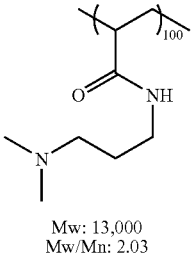

Mw: 13,000
Mw/Mn: 2.03

Polymer 8

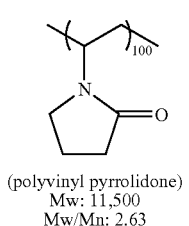

(polyvinyl pyrrolidone)
Mw: 11,500
Mw/Mn: 2.63

The components in Table 2 are identified below.
Solvents: S1 isobutyl alcohol
S2 2-methyl-1-butanol
S3 diisoamyl ether
S4 butanol
S5 deionized water Crosslinkers: C1, C2 and C3

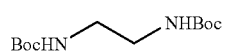 C1

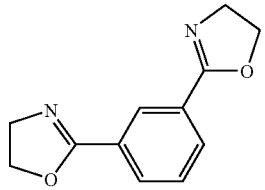 C2

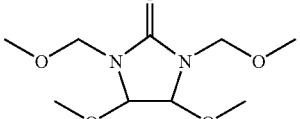 C3

Note that Boc is t-butoxycarbonyl.

TABLE 2

| | | Resist-modifying composition | Crosslinker (pbw) | Base resin (pbw) | Solvent (pbw) |
|---|---|---|---|---|---|
| Example | 1-1 | A | C1/C2(15/15) | Polymer 3(80) | S1(4,000) |
| | 1-2 | B | C2(20) | Polymer 4(80) | S1(4,000) |
| | 1-3 | C | C1(20) | Polymer 5(80) | S1(4,000) |
| | 1-4 | D | C3(20) | Polymer 6(80) | S1(4,000) |
| | 1-5 | E | — | Polymer 3(80) | S2(3,600)/S3(400) |
| | 1-6 | F | C2(20) | Polymer 7(80) | S4(4,000) |
| Reference | 1-1 | G | C3(20) | Polymer 8(80) | S1(4,000) |
| Example | 1-2 | H | C1/C2(15/15) | Polymer 8(80) | S1(4,000) |
| | 1-3 | I | C3(20) | Polymer 6(80) | S5(4,000) |

Examples 2-1 to 2-6 and Comparative Examples 1-1 to 1-3

Double Patterning Test by Line-and-Space Pattern Formation

On a substrate (silicon wafer) having an antireflective coating (ARC-29A, Nissan Chemical Industries Ltd.) of 95 nm thick, Resist 1 in Table 1 as the first resist composition was spin coated, then baked on a hot plate at 100° C. for 60 seconds to form a resist film of 100 nm thick. Using an ArF excimer laser scanner model NSR-S610C (Nikon Corp., NA 1.30, σ 0.98/0.78, 35° cross-pole illumination, azimuthally polarized illumination, 6% halftone phase shift mask), the resist film was exposed to a Y-direction 50-nm line/200-nm pitch pattern (depicted at A in FIG. 7). Immediately after exposure, the resist film was baked (PEB) at 100° C. for 60 seconds and then developed for 30 seconds with a 2.38 wt % TMAH aqueous solution, obtaining a first line-and-space pattern having a line size of 50 nm.

Each of the resist-modifying compositions A to I shown in Table 2 was coated on the first resist pattern and baked at 140° C. for 60 seconds. It was developed for 30 seconds with a 2.38 wt % TMAH aqueous solution, rinsed with deionized water, and baked at 140° C. for 60 seconds, completing modification treatment of the first pattern.

Figure 7:
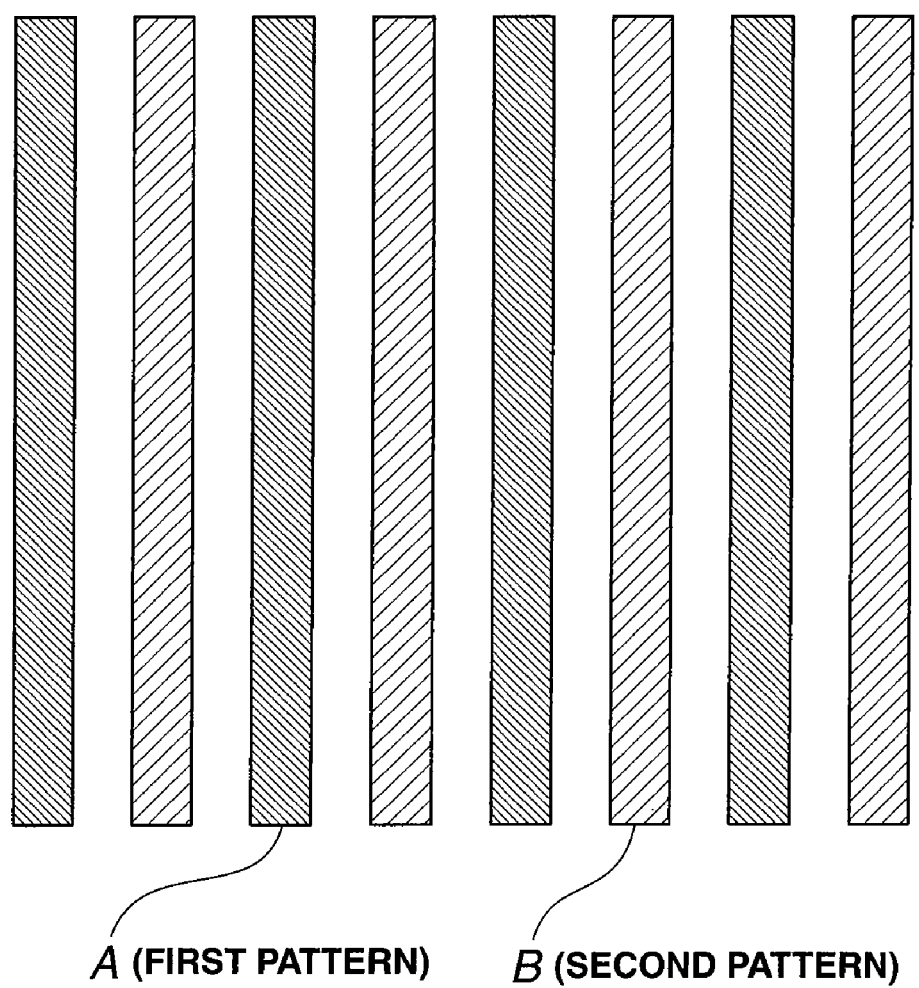
FIG. 7 is a plan view of a line-and-space pattern formed in the double patterning test in Examples.

Next, Resist 2 in Table 1 as the second resist composition was coated onto the first resist pattern-bearing substrate and baked at 95° C. for 60 seconds to form a second resist film. Using an ArF excimer laser scanner model NSR-S610C (Nikon Corp., NA 1.30, σ 0.98/0.78, 35° cross-pole illumination, azimuthally polarized illumination, 6% halftone phase shift mask), the second resist film was exposed to a Y-direction 50-nm line/200-nm pitch pattern which was shifted 100 nm from the first pattern in X-direction. Immediately after exposure, the second resist film was baked (PEB) at 90° C. for 60 seconds and then developed for 30 seconds with a 2.38 wt % TMAH aqueous solution to complete double patterning. A line-and-space pattern having a line size of 50 nm was obtained as a combination of first and second patterns (FIG. 7).

The line width and height of the first pattern were measured by a measuring SEM (S-9380, Hitachi, Ltd.) and cross-sectional SEM. The results are shown in Table 3.

developed for 30 seconds with a 2.38 wt % TMAH aqueous solution, obtaining a first line-and-space pattern having a line size of 60 nm.

The resist-modifying composition A or E shown in Table 2 was coated on the first resist pattern and baked at 140° C. for 60 seconds. It was developed for 30 seconds with a 2.38 wt % TMAH aqueous solution, rinsed with deionized water, and baked at 140° C. for 60 seconds, completing modification treatment of the first pattern.

Next, Resist 2 in Table 1 as the second resist composition was coated onto the first resist pattern-bearing substrate and baked at 95° C. for 60 seconds to form a second resist film. Using an ArF excimer laser scanner model NSR-S610C (Nikon Corp., NA 1.20, σ 0.92, 35° dipole illumination), the second resist film was exposed to a Y-direction 60-nm line/

TABLE 3

|  |  | 1st resist composition | Resist-modifying composition | 2nd resist composition | Size (width/height) of 1st pattern after development | Size (width/height) of 1st pattern after 2nd pattern formation |
|---|---|---|---|---|---|---|
| Example | 2-1 | Resist 1 | A | Resist 2 | 50 nm/90 nm | 52 nm/82 nm |
|  | 2-2 | Resist 1 | B | Resist 2 | 50 nm/90 nm | 52 nm/78 nm |
|  | 2-3 | Resist 1 | C | Resist 2 | 50 nm/90 nm | 54 nm/78 nm |
|  | 2-4 | Resist 1 | D | Resist 2 | 50 nm/90 nm | 51 nm/80 nm |
|  | 2-5 | Resist 1 | E | Resist 2 | 50 nm/90 nm | 45 nm/70 nm |
|  | 2-6 | Resist 1 | F | Resist 2 | 50 nm/90 nm | 56 nm/80 nm |
| Comparative Example | 1-1 | Resist 1 | G | Resist 2 | 50 nm/90 nm | pattern vanished |
|  | 1-2 | Resist 1 | H | Resist 2 | 50 nm/90 nm | pattern vanished |
|  | 1-3 | Resist 1 | I | Resist 2 | 50 nm/90 nm | pattern anomaly* |

*Resist-modifying composition I could not be uniformly coated, modifying treatment was insufficient, and 1st pattern was absent in most areas.

It is evident from Table 3 that in Examples, the first pattern was maintained satisfactory after the second pattern was formed. In Comparative Examples, the first pattern vanished.

Example 3 and Comparative Example 2

Double Patterning Test by Hole Pattern Formation

Figure 8:
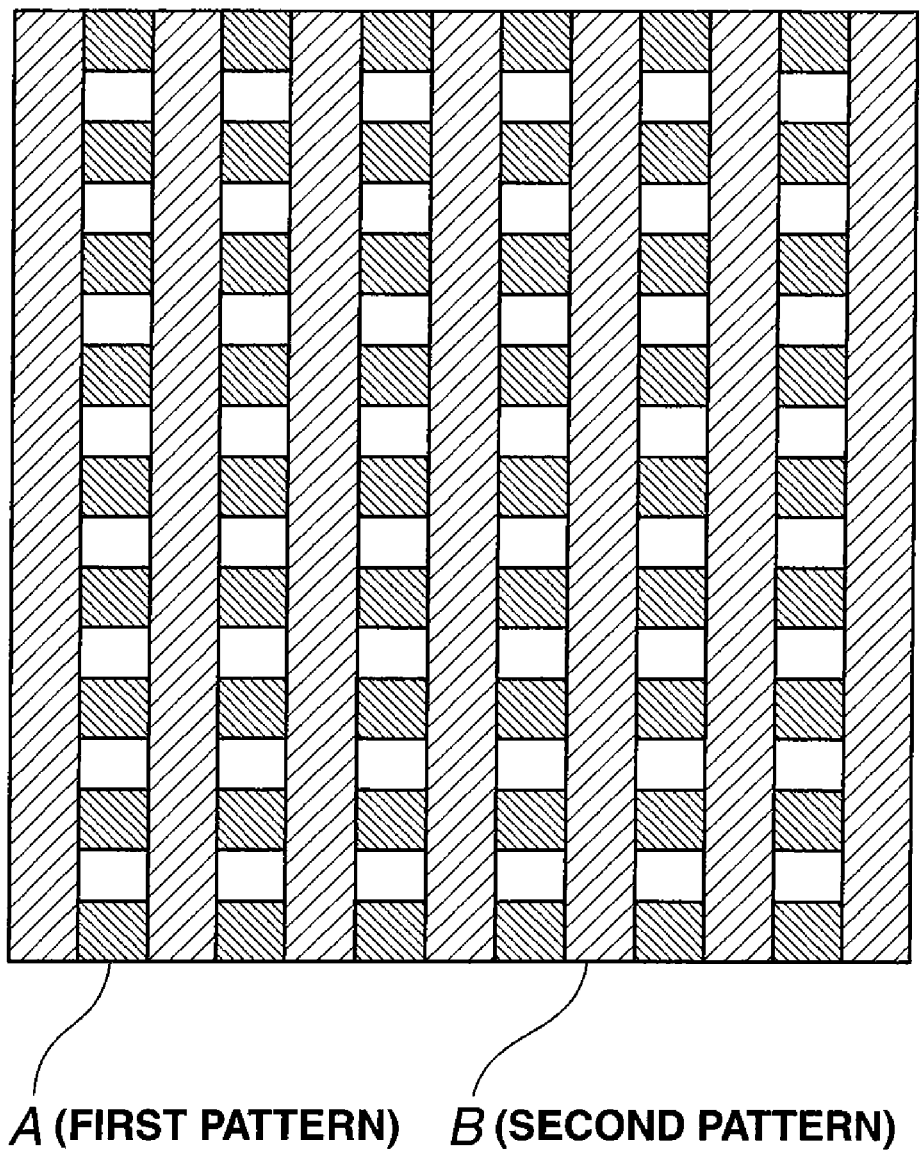
FIG. 8 is a plan view of a hole pattern formed in the double patterning test in Examples.

On a substrate (silicon wafer) having an antireflective coating (ARC-29A, Nissan Chemical Industries Ltd.) of 95 nm thick, Resist 1 in Table 1 as the first resist composition was spin coated, then baked on a hot plate at 100° C. for 60 seconds to form a resist film of 100 nm thick. Using an ArF excimer laser scanner model NSR-S610C (Nikon Corp., NA 1.20, σ 0.92, 35° dipole illumination), the resist film was exposed to a X-direction 60-nm line/120-nm pitch pattern (depicted at A in FIG. 8). Immediately after exposure, the resist film was baked (PEB) at 100° C. for 60 seconds and then 120-nm pitch pattern (depicted at B in FIG. 8) which extended orthogonally to the first pattern. Immediately after exposure, the second resist film was baked (PEB) at 90° C. for 60 seconds and then developed for 30 seconds with a 2.38 wt % TMAH aqueous solution, obtaining a hole pattern (FIG. 8).

The diameter of the hole pattern was measured by a measuring SEM (S-9380, Hitachi, Ltd.). The results are shown in Table 4.

TABLE 4

|  | 1st resist composition | Resist-modifying composition | 2nd resist composition | Hole size in Y-direction | Hole size in X-direction |
|---|---|---|---|---|---|
| Example 3 | Resist 1 | A | Resist 2 | 60 nm | 60 nm |
| Comparative Example 2 | Resist 1 | E | Resist 2 | 1st pattern vanished | 1st pattern vanished |

It is evident from Table 4 that in Example 3, the first pattern was maintained satisfactory after pattern modifying treatment and second pattern formation, and the second patterning resulted in formation of the desired hole pattern. Comparative Example 2 failed to form a hole pattern because of a failure to retain the first pattern.

The pattern forming process and the resist-modifying composition of the invention are advantageously applicable to the double patterning process of processing a substrate through two exposures and a single dry etching. Because of satisfactory retention of the first resist pattern, the invention is very useful.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2009-125429 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist-modifying composition comprising a base resin, an alcohol-based solvent, and a crosslinker,
said base resin being a polymer comprising recurring units having the general formula (1):

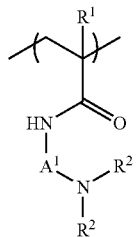
(1)

wherein $A^1$ is a straight, branched or cyclic $C_2$-$C_8$ alkylene group which may contain an ether group, $R^1$ is hydrogen or methyl, $R^2$ is each independently a $C_1$-$C_4$ alkyl group or two $R^2$ may bond together to form a $C_4$-$C_{10}$ heterocycle with the nitrogen atom to which the are attached and
said crosslinker being a water-insoluble crosslinker having the general formula (3) or (4) or formula (C3):

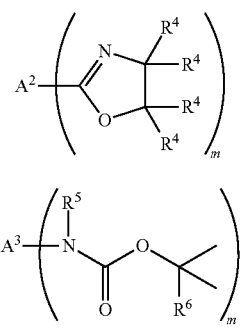

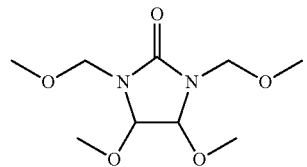
(C3)

wherein m is each independently an integer of 2 to 6, $A^2$ is a single bond, m-valent $C_1$-$C_{20}$ hydrocarbon group, or m-valent $C_6$-$C_{15}$ aromatic group, $A^3$ is a m-valent $C_2$-$C_{20}$ hydrocarbon group which may contain a hydroxyl or ether group, $R^4$ is each independently hydrogen or methyl, $R^5$ is hydrogen or a $C_1$-$C_4$ alkyl group, and $R^6$ is methyl or ethyl.

2. The resist-modifying composition of claim 1, wherein the polymer as the base resin further comprises recurring units having the general formula (2):

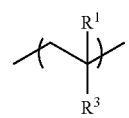
(2)

wherein $R^1$ is hydrogen or methyl, and $R^3$ is a $C_6$-$C_{15}$ aryl group, $C_3$-$C_{10}$ hetero-aryl group, or $C_4$-$C_6$ lactam group.

3. The resist-modifying composition of claim 2, wherein $A^1$ in formula (1) is ethylene or trimethylene, $R^2$ in formula (1) is methyl or ethyl, and $R^3$ in formula (2) is a $C_4$-$C_6$ lactam group.

4. The resist-modifying composition of claim 1 wherein said base resin is a polymer comprising recurring units selected from the group consisting of those having the following formulae:

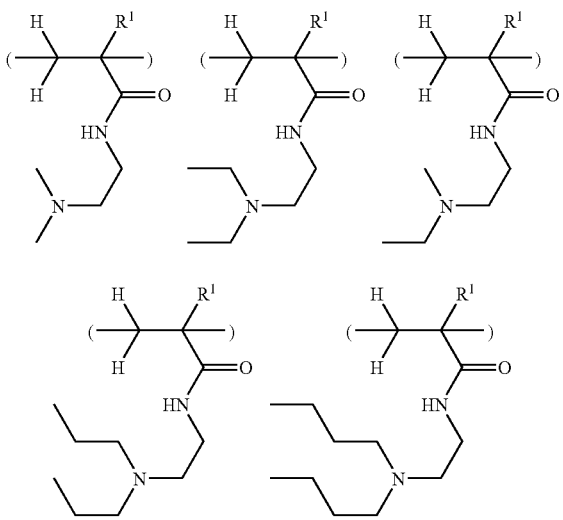

-continued

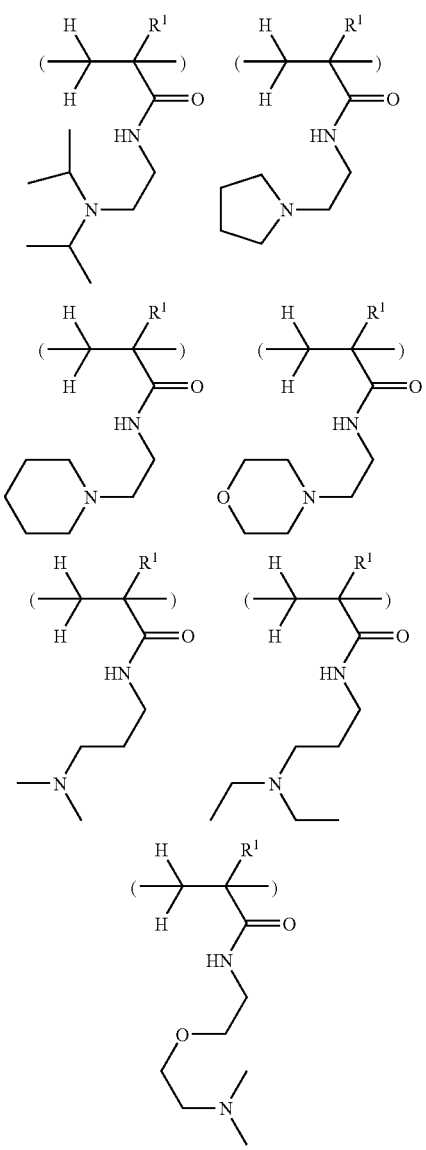

wherein R¹ is hydrogen or methyl.

5. The resist-modifying composition of claim 1 wherein said crosslinker is at least one selected from the group consisting of 2,2'-bis(2-oxazoline), 2,2'-ethylenebis(2-oxazoline), 2,2'-(1,3-phenylene)bis(2-oxazoline), 2,2'-(1,4-phenylene)bis(2-oxazoline), and compounds having the following formulae:

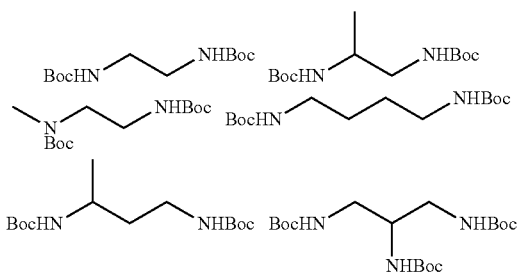

-continued

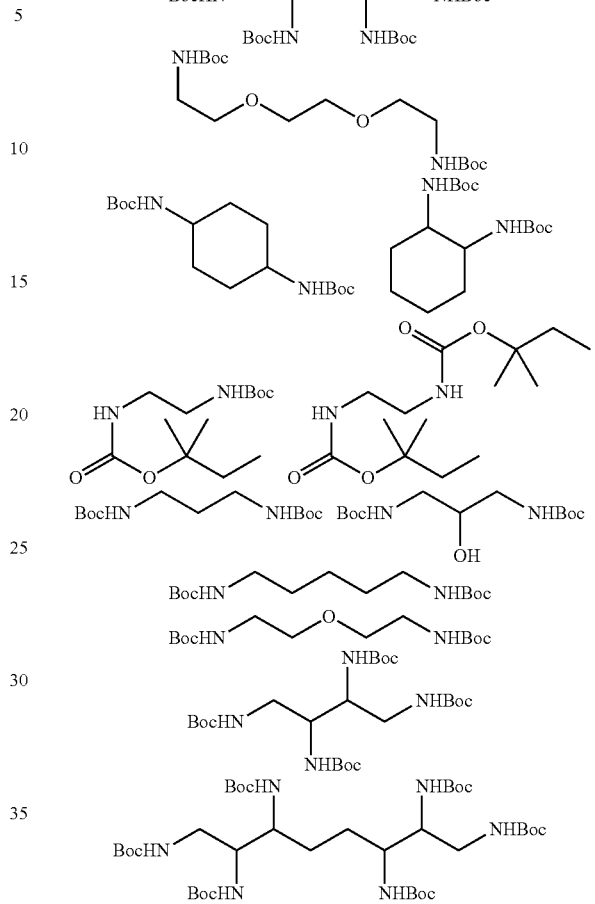

wherein Boc is t-butoxycarbonyl.

6. A pattern forming process comprising at least the steps of:
(1) coating a first positive resist composition comprising a polymer comprising recurring units adapted to increase alkali solubility under the action of acid and recurring units having lactone structure onto a substrate and baking to form a first resist film, exposing the first resist film to high-energy radiation, post-exposure baking, and developing the first resist film with an alkaline developer to form a first resist pattern,
(2) applying a resist-modifying composition to the first resist pattern and heating to modify the first resist pattern, and
(3) coating a second positive resist composition thereon and baking to form a second resist film, exposing the second resist film to high-energy radiation, post-exposure baking, and developing the second resist film with an alkaline developer to form a second resist pattern, step (2) using the resist-modifying composition of claim 1.

7. A resist-modifying composition comprising a base resin, an alcohol-based solvent, and a crosslinker,
said base resin being a polymer comprising recurring units having the general formula (1):

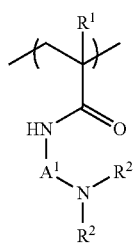

(1)

wherein $A^1$ is a straight, branched or cyclic $C_2$-$C_8$ alkylene group which may contain an ether group, $R^1$ is a hydrogen or methyl, $R^2$ is each independently a $C_1$-$C_4$ alkyl group or two $R^2$ may bond together to form a $C_4$-$C_{10}$ heterocycle with the nitrogen atom to which they are attached, said crosslinker being at least one selected from the group consisting of melamine, glycoluril, benzoguanamine, urea, β-hydroxyalkylamide, isocyanurate, aziridine, and amine crosslinkers.

8. The resist-modifying composition of claim 7, wherein the polymer as the base resin further comprises recurring units having the general formula (2):

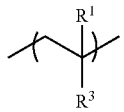

(2)

wherein $R^1$ is a hydrogen or methyl, and $R^3$ is a $C_6$-$C_{15}$ aryl group, $C_3$-$C_{10}$ hetero-aryl group, or $C_4$-$C_6$ lactam group.

9. The resist-modifying composition of claim 8, wherein $A^1$ in formula (1) is ethylene or trimethylene, $R^2$ in formula (1) is methyl or ethyl, and $R^3$ in formula (2) is a $C_4$-$C_6$ lactam group.

10. A pattern forming process comprising at least the steps of:

(1) coating a first positive resist composition comprising a polymer comprising recurring units adapted to increase alkali solubility under the action of acid and recurring units having lactone structure onto a substrate and baking to form a first resist film, exposing the first resist film to high-energy radiation, post-exposure baking, and developing the first resist film with an alkaline developer to form a first resist pattern, (2) applying a resist-modifying composition to the first resist pattern and heating to modify the first resist pattern, and (3) coating a second positive resist composition thereon and baking to form a second resist film, exposing the second resist film to high-energy radiation, post-exposure baking, and developing the second resist film with an alkaline developer to form a second resist pattern, step (2) using the resist-modifying composition of claim 7.

* * * * *